United States Patent
Fujimaki

(10) Patent No.: US 7,154,183 B2
(45) Date of Patent: Dec. 26, 2006

(54) SEMICONDUCTOR DEVICE HAVING MULTILEVEL INTERCONNECTION

(75) Inventor: Takeshi Fujimaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/983,090

(22) Filed: Nov. 8, 2004

(65) Prior Publication Data

US 2005/0142840 A1 Jun. 30, 2005

(30) Foreign Application Priority Data

Nov. 7, 2003 (JP) ............................. 2003-378423

(51) Int. Cl.
*H01L 21/31* (2006.01)
*H01L 21/44* (2006.01)
(52) U.S. Cl. .................. 257/774; 257/758; 257/775; 257/E23.145; 257/E21.576; 438/618; 438/622
(58) Field of Classification Search ................ 257/774, 257/758, 775; 438/618, 622
See application file for complete search history.

(56) References Cited

U.S. PATENT DOCUMENTS 6,468,894 B1 10/2002 Yang et al.

2004/0113238 A1 6/2004 Hasunuma et al.
2004/0173905 A1* 9/2004 Kamoshima et al. ........ 257/758

FOREIGN PATENT DOCUMENTS

JP 2001-196372 A 7/2001

OTHER PUBLICATIONS

K. Yoshida et al., "Stress-Induced Voiding Phenomena for an actual CMOS LSI Interconnects," International Electron Devices Meeting, Dec. 2002.

* cited by examiner

*Primary Examiner*—Dung A. Le
(74) *Attorney, Agent, or Firm*—Foley & Lardner LLP

(57) ABSTRACT

A semiconductor device having a multilevel interconnection encompasses (a) a subject level interconnect, (b) a subject interlevel insulator disposed on the subject level interconnect, (c) a connecting via-plug buried in the subject interlevel insulator, the bottom surface of the connecting via-plug is in contact with the subject level interconnect, (d) a dummy via-plug buried in the subject interlevel insulator, the top surface of the dummy via-plug is electrically open, and (e) an upper level interconnect of the subject level interconnect, disposed at the top surface of the subject interlevel insulator, being contact with the top surface of the connecting via-plug.

19 Claims, 18 Drawing Sheets

SEMICONDUCTOR DEVICE HAVING MULTILEVEL INTERCONNECTION

CROSS REFERENCE TO RELATED APPLICATIONS

This application claims benefit of priority under 35 USC 119 based on Japanese Patent Application No. P2003-378423 filed Nov. 7, 2003, the entire contents of which are incorporated by reference herein.

BACKGROUND OF THE INVENTION

1. Field of the Invention

The present invention relates to a semiconductor device having a multilevel interconnection and a method for manufacturing the semiconductor device.

2. Description of the Related Art

Multilevel interconnections have been developed so as to improve the integration density and the operation speed of semiconductor devices. Instead of aluminum interconnects used in earlier stage of semiconductor technology, copper interconnects with higher tolerable current density and higher melting point than those of aluminum interconnects have been developed for achieving lower wiring resistance and increasing current density and reliability of the interconnection.

Nevertheless, failures due to increase in interconnect resistance and disconnection caused by stress migration have occurred in a semiconductor device including copper interconnects.

"The stress migration" is a phenomenon in which metallic atoms in metallic interconnects move so as to reduce a stress that is applied to the metallic interconnects due to the difference in thermal expansion coefficients between the metallic interconnects and interlevel insulator layers surrounding the metallic interconnects. FIGS. 1 and 2 show a semiconductor device having a first level interconnect 13 and a second level interconnect 15 formed with a copper film, respectively, and a connecting via-plug 31 implemented by a copper film. In FIG. 1, which shows a top view, a second interlevel insulator 14 (shown in FIG. 2) is not shown, however, the connecting via-plug 31 is shown as if the second level interconnect 15 is transparent. The following other top views pertaining to the embodiments of the present invention are represented in the same manner to avoid cluttering up the drawings, although there may be a plurality of upper interlevel insulators actually. In addition, in FIG. 1, "a void 39" generated by stress migration is represented by broken line as if the second level interconnect 15 is transparent. FIG. 2 is a cross-sectional view taken on line II—II, cutting along the direction on which the first level interconnect 13 extends as shown in FIG. 1. In the semiconductor device shown in FIGS. 1 and 2, a void 39 is generated due to stress migration on the top surface of the first level interconnect 13 especially at the interface between the connecting via-plug 31 and the first level interconnect 13. This is because a strong stress is applied to the interface between the connecting via-plug 31 and the first level interconnect 13 during a via formation process and an interconnect formation process.

As described above, there have been problems such as increase in resistance between interconnect layers and disconnection failures due to the void 39 generated by stress migration.

SUMMARY OF THE INVENTION

An aspect of the present invention inheres in a semiconductor device having a multilevel interconnection encompassing (a) a subject level interconnect, (b) a subject interlevel insulator disposed on the subject level interconnect, (c) a connecting via-plug buried in the subject interlevel insulator, the bottom surface of the connecting via-plug is in contact with the subject level interconnect, (d) a dummy via-plug buried in the subject interlevel insulator, the top surface of the dummy via-plug is electrically open, and (e) an upper level interconnect of the subject level interconnect, disposed at the top surface of the subject interlevel insulator, being contact with the top surface of the connecting via-plug.

Another aspect of the present invention inheres in a semiconductor device having a multilevel interconnection encompassing (a) a subject level interconnect, (b) a subject interlevel insulator disposed on the subject level interconnect, (c) a connecting via-plug buried in the subject interlevel insulator, the bottom surface of the connecting via-plug is in contact with the subject level interconnect, (d) a dummy via-plug buried in the subject interlevel insulator, and (e) an upper level interconnect of the subject level interconnect, disposed at the top surface of the subject interlevel insulator, being contact with the top surfaces of the connecting and dummy via-plugs. Here, the area of the interface between the bottom surface of the connecting via-plug and the top surface of the subject level interconnect is larger than the cross-sectional area of the dummy via-plug cut along a plane parallel to a plane on which the subject level interconnect extends.

Still another aspect of the present invention inheres in a method for manufacturing a semiconductor device having a multilevel interconnection encompassing (a) forming a subject level interconnect, (b) laminating a subject interlevel insulator on the subject level interconnect, (c) digging a connecting via-hole and a dummy via-hole in the subject interlevel insulator so as to bare a part of the subject level interconnect, (d) digging a damascene groove at the top surface of and in the subject interlevel insulator so as to pass over the connecting via-hole, and (e) forming a metallic film in the connecting via-hole, the dummy via-hole and the damascene groove so as to form a dummy via-plug buried in the dummy via-hole, the top surface of the dummy via-plug is electrically open, an upper level interconnect of the subject level interconnect buried in the damascene groove and a connecting via-plug buried in the connecting via-hole, the top surface of the connecting via-plug is connected to the bottom surface of the upper level interconnect.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE INVENTIOPN

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention. Prepositions, such as "on", "over", "under", "beneath", and "normal" are defined with respect to a planar surface of the substrate, regardless of the orientation in which the substrate is actually held. A layer is on another layer even if there are intervening layers

First Embodiment

Figure 1:
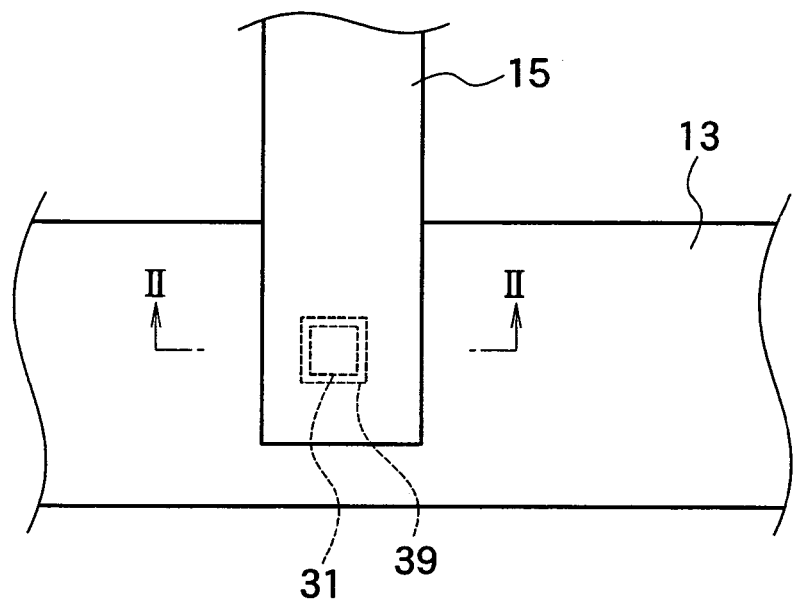
FIG. 1 is a schematic top view showing a semiconductor device used in an earlier technology.
Figure 2:
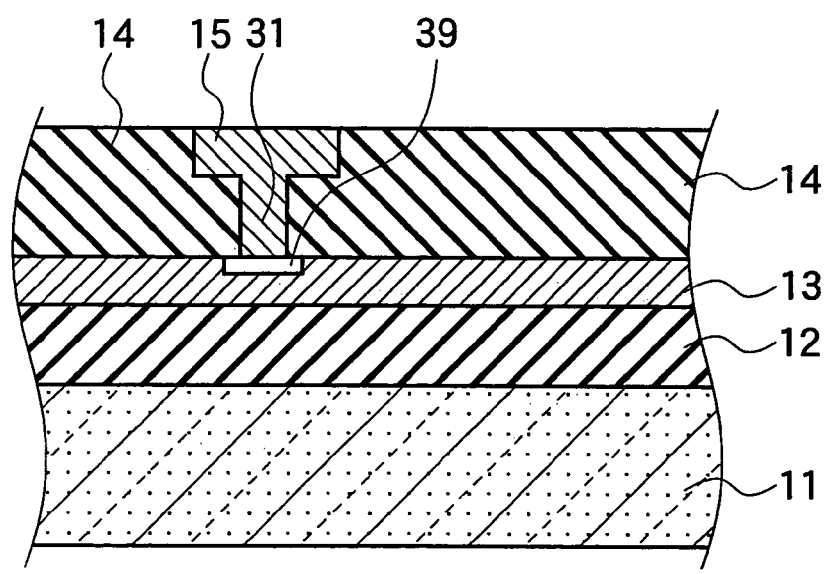
FIG. 2 is a cross-sectional view taken on line II—II in FIG. 1.
Figure 3:
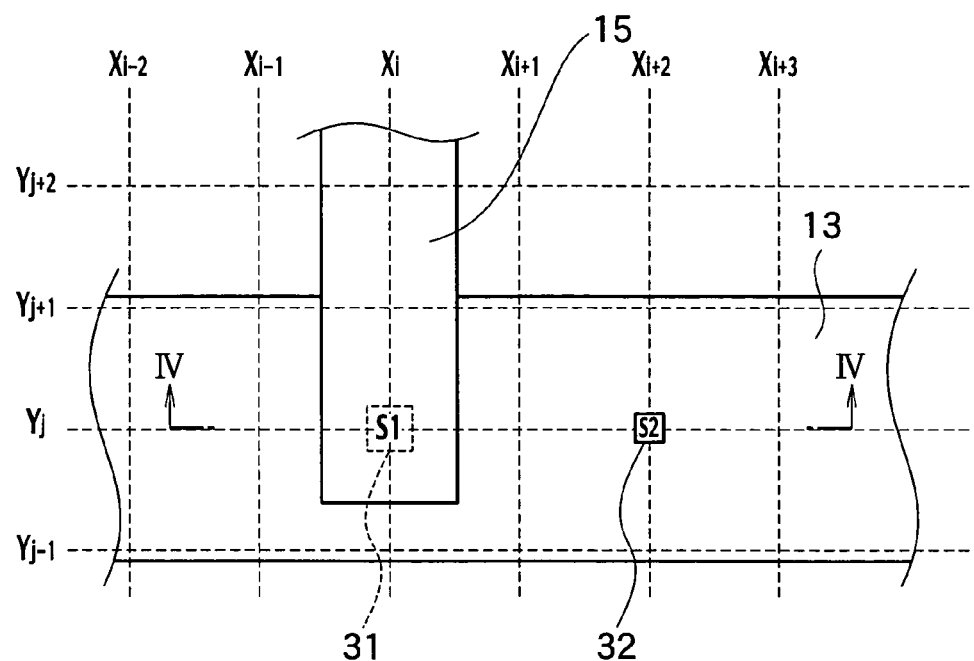
FIG. 3 is a schematic top view showing a configuration of a semiconductor device according to a first embodiment of the present invention.
Figure 4:
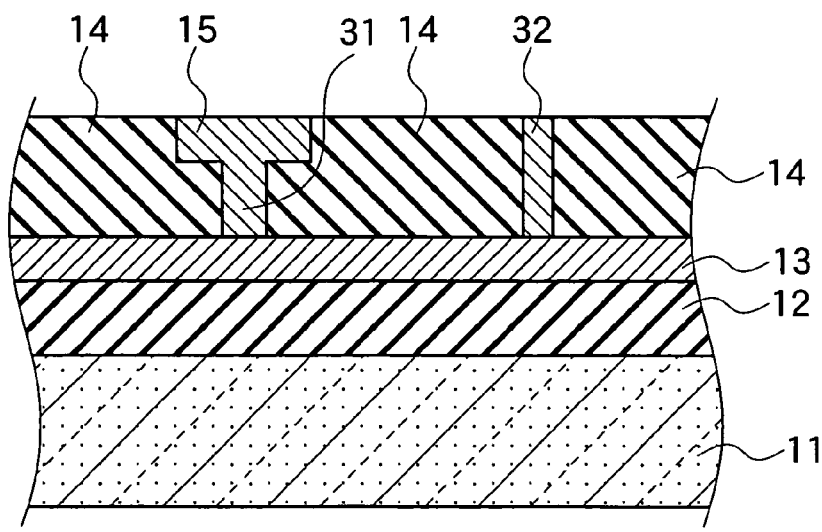
FIG. 4 is a cross-sectional view taken on line IV—IV in FIG. 3.

As shown in FIGS. 3 and 4, a semiconductor device according to a first embodiment of the present invention has a multilevel interconnection including: a subject level ("first level", for example) interconnect 13, a subject interlevel insulator ("second interlevel insulator" when the subject level is first level, for example) 14, which is disposed on the subject level (first level) interconnect 13, a connecting via-plug 31, which is formed by burying a first via-hole in the subject interlevel insulator (second interlevel insulator) 14 with conductive material. The bottom surface of the connecting via-plug 31 is in contact with the subject level (first level) interconnect 13. The semiconductor device according to the first embodiment of the present invention further encompasses a dummy via-plug 32, which is made by burying a second via-hole in the subject interlevel insulator (second interlevel insulator) 14 with conductive material. The bottom surface of the dummy via-plug 32 is in contact with the subject level (first level) interconnect 13, and the top surface of the dummy via-plug 32 is electrically open. The semiconductor device according to the first embodiment further encompasses an upper level ("second level" when the subject level is first level, for example) interconnect 15 of the subject level interconnect 13, which is disposed at the top surface of the subject interlevel insulator (second interlevel insulator) 14 and is in contact with the top surface of the connecting via-plug 31.

In addition, the semiconductor device according to the first embodiment embraces a semiconductor substrate 11 and a lower interlevel insulator 12, which may be defined as the "first interlevel insulator", when the subject interlevel insulator is taken as the second interlevel insulator, for example. The lower interlevel insulator 12 is disposed on the semiconductor substrate 11. Then, the subject level (first level) interconnect 13 is disposed on the lower interlevel insulator (first interlevel insulator) 12.

A conductive film such as a metallic film, which includes copper as a main component, is available for the subject level (first level) interconnect 13, the upper level (second level) interconnect 15, the connecting via-plug 31, and the dummy via-plug 32. A silicon oxide film ($SiO_2$ film) or the like is available for the lower interlevel insulator (first interlevel insulator) 12 and the subject interlevel insulator (second interlevel insulator) 14. The upper level (second level) interconnect 15 is buried in a damascene groove formed in the subject interlevel insulator (second interlevel insulator) 14; wherein the top surface of the upper level (second level) interconnect 15 is planarized with the top surface of the subject interlevel insulator (second interlevel insulator) 14. Here, the area of the interface between the bottom surface of the connecting via-plug 31 and the top surface of the subject level (first level) interconnect 13 is defined to be "the interface area S1"; and the area of the interface between the bottom surface of the dummy via-plug 32 and the top surface of the subject level (first level) interconnect 13 is defined to be "the interface area S2". The interface area S1 may be approximately same as the area of the interface between the top of the connecting via-plug 31 and the bottom surface of the upper level (second level) interconnect 15, because the connecting via-plug 31 may have a geometry of a cylindrical pillar or a prism. The interface area S2 may be approximately same as the cross-sectional area of the dummy via-plug 32 cut along a plane parallel to a plane on which the subject level (first level) interconnect 13 extending, because the dummy via-plug 32 may have a geometry of a cylindrical pillar or a prism Under the definitions, the interface area S1 is larger than the interface area S2.

As shown in FIG. 3, interconnect patterns of the semiconductor device according to the first embodiment of the present invention are provided based on an imaginary wiring grid implemented by a plurality of regularly spaced first lines (vertical grid lines) $X_{i-1}$, $X_i$, $X_{i+1}$, $X_{i+2}$, . . . and a plurality of regularly spaced first lines (horizontal grid lines) $Y_{j-1}$, $Y_j$, $Y_{j+1}$, $Y_{j+2}$, . . . intersecting with the first lines $X_{i-1}$, $X_i$, $X_{i+1}$, $X_{i+2}$, . . . . The imaginary wiring grid is employed in the layout design of the interconnect patterns. For example, as shown in FIG. 3, the connecting via-plug 31 is formed at the intersection of the first line (vertical grid line) $X_i$ and the second line (horizontal grid line) $Y_j$.

The connecting via-plug 31, which is necessary to perform the operation of the semiconductor device, electrically connects the subject level (first level) interconnect 13 and the upper level (second level) interconnect 15 to achieve a desired circuit operation. On the other hand, the dummy via-plug 32 is "a sacrificial via-plug" which does not affect the semiconductor device operation. Therefore, it is different from the connecting via-plug 31 in that the dummy via-plug 32 does not have to electrically connect the subject level (first level) interconnect 13 and the upper level (second level) interconnect 15.

According to the architecture of multilevel interconnection in the semiconductor device of the first embodiment of the present invention, a void due to stress migration is generated at the dummy via-plug 32, the void is formed at a localized position on which a stress is applied during a via formation process and a copper interconnect formation process, as well as at the connecting via-plug 31, which is necessary for a desired semiconductor device operation. The architecture prevents voids from generating and concentrating at the connecting via-plug 31, and also prevents failures from occurring in the semiconductor device due to increase in the resistance of the connecting via-plug 31 or disconnection.

An exemplary case of forming the subject level (first level) interconnect 13 and the upper level (second level) interconnect 15 using a copper film, and filling via-holes so as to form the connecting via-plug 31 and the dummy via-plug 32 with a copper film is described below.

Figure 5:
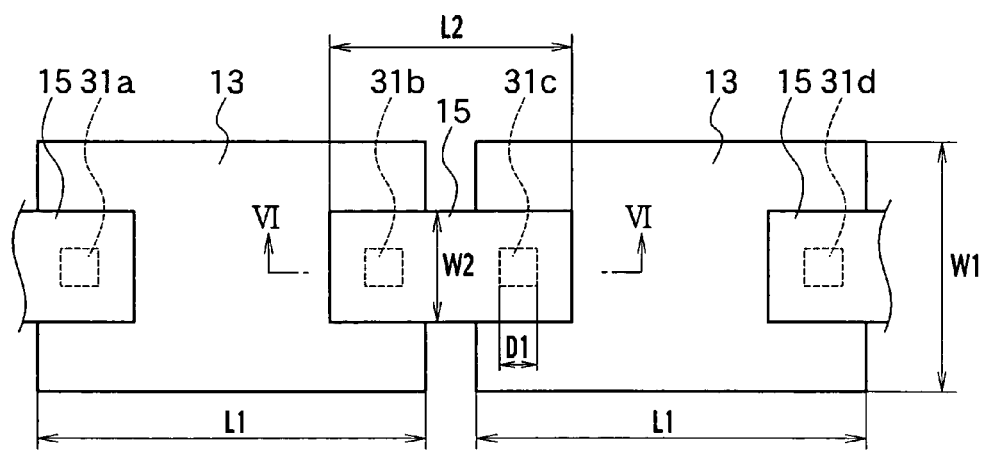
FIG. 5 is a schematic top view showing a configuration of a via-chain where interconnect patterns and connecting via-plugs are aligned in series.
Figure 6:
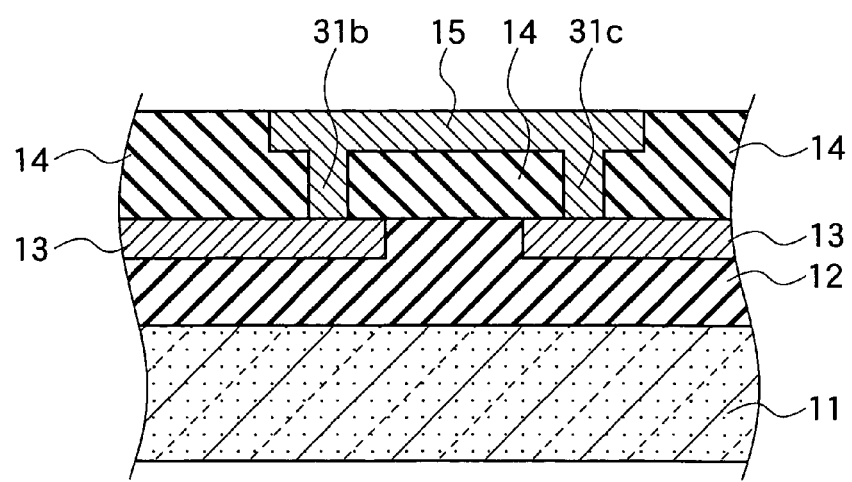
FIG. 6 is a cross-sectional view taken on line VI—VI in FIG. 5.
Figure 7:
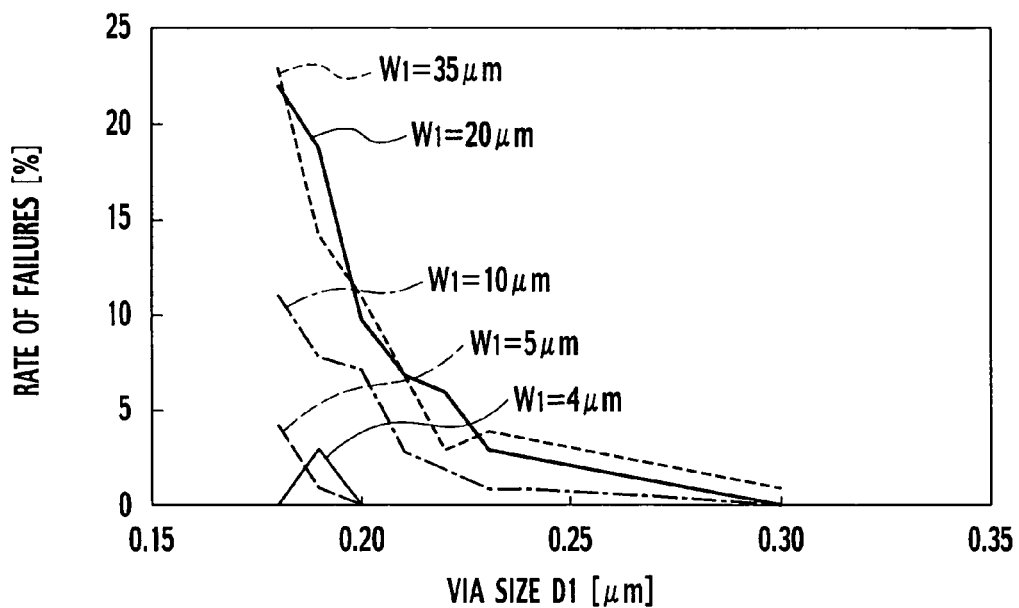
FIG. 7 is a graph showing a relationship between rate of failures due to stress migration in via-chain and via sizes employed in the via-chain, for various interconnect widths.
Figure 8:
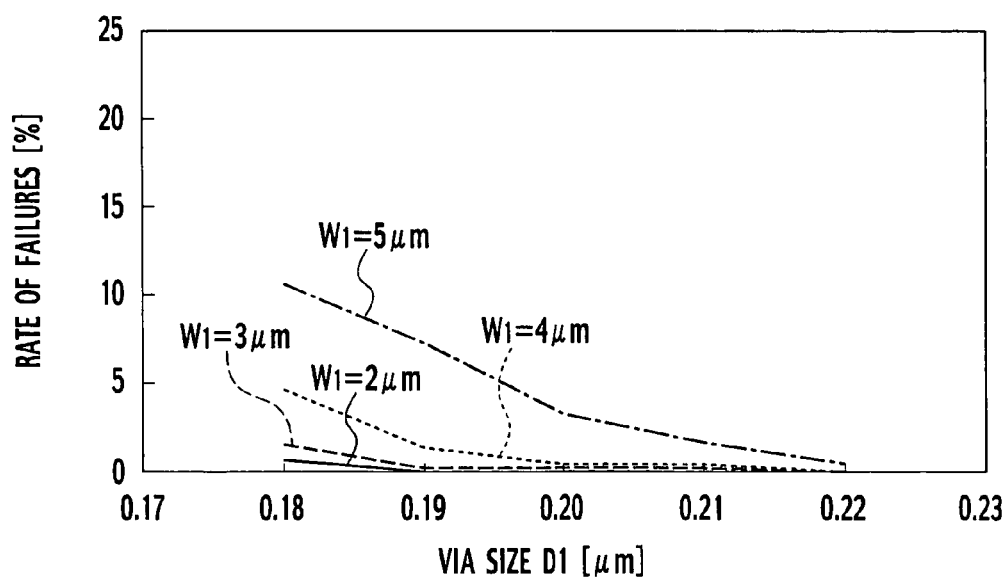
FIG. 8 is a graph showing another relationship between rate of failures due to stress migration in anther via-chain, which is fabricated by different method from the via-chain shown in FIG. 7, and via sizes employed in the via-chain, for various interconnect widths.

The relationship among the size of the connecting via-plug 31, the width of the subject level (first level) interconnect 13, and the incidence rate of disconnection failures caused by voids due to stress migration occurred at the connecting via-plug 31 is described below. FIGS. 5 and 6 schematically show a via-chain, which is formed by consecutively connecting in series with a plurality of connecting via-plugs 31a, 31b, 31c, and 31d . . . , a plurality of subject level (first level) interconnects 13, each having a length L1 of approximately 20 μm, a plurality of upper level (second level) interconnects 15, each having a length L2 of approximately 10 μm and a width W2 of approximately 1.1 μm. In FIG. 5, only a single unit made up of four connecting via-plugs 31a, 31b, 31c, and 31d is shown; however, many such units, for example, 400 connecting via-plugs 31a, 31b, 31c, and 31d . . . are consecutively connected in series along the via-chain. FIGS. 7 and 8 show the relationship among the rate of disconnection failures (hereafter referred to as "failure rate") caused by voids due to stress migration occurred in the connecting via-plugs 31a, . . . , the via sizes D1 of the connecting via-plugs 31a, . . . , and the width W1 of the subject level (first level) interconnect 13; where, the via size D1 is the length of a side of a square at photomask-level pattern. FIGS. 7 and 8 show failure rates of the via-chains formed using respective different fabrication methods. FIGS. 7 and 8 are graphs for different widths W1 of the subject level (first level) interconnect 13; where the abscissa represents via size D1 of each of the connecting via-plugs 31a, . . . , and the ordinate represents the failure rate. FIGS. 7 and 8 show that the wider the width W1 of the subject level (first level) interconnect 13, the higher the failure rate, and the smaller the via size D1 of each of the connecting via-plugs 31a, . . . , the higher the failure rate. In other words, if the via sizes D1 of the connecting via-plugs 31a, . . . , are the same, the wider the width W1 of the subject level (first level) interconnect 13, the more the disconnection failures occur in the connecting via-plugs 31a, . . . . In addition, if the width W1 of the subject level (first level) interconnect 13 is the same, the smaller the via sizes D1 of the connecting via-plugs 31a, . . . , the more the disconnection failures occur in the connecting via-plugs 31a, . . . .

As described above, the smaller the ratio of the interface area between the subject level (first level) interconnect 13 and the connecting via-plug 31 to the area of the subject level (first level) interconnect 13, the higher the failure rate for the connecting via-plugs 31. Therefore, it is possible to reduce the failure rate for the connecting via-plugs 31 by providing the dummy via-plug 32 in addition to the connecting via-plugs 31. In addition, formation of the interface area between the dummy via-plug 32 and the subject level (first level) interconnect 13 smaller than that between the connecting via-plug 31 and the subject level (first level) interconnect 13 may lead to an intentional generation of voids, concentrating at the dummy via-plug 32. Therefore, the methodology of forming smaller dummy via-plug is more effective to reduce the failure rate for the connecting via-plug 31.

Figure 9:
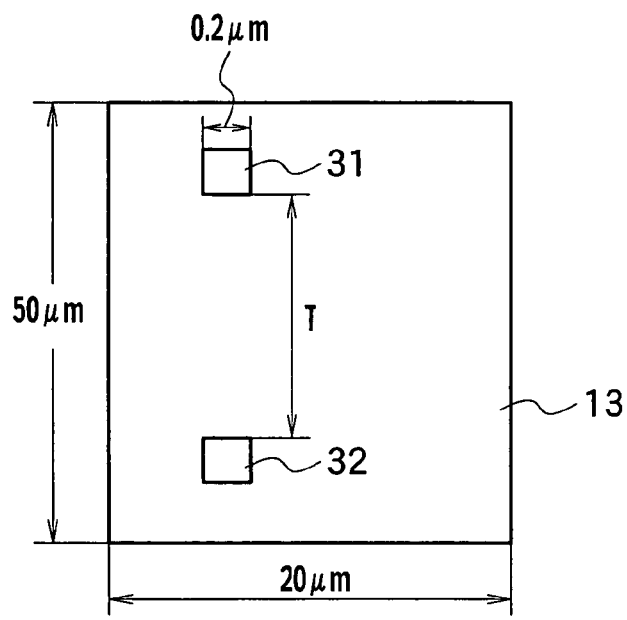
FIG. 9 is a schematic top view defining "the inter-via distance"
Figure 10:
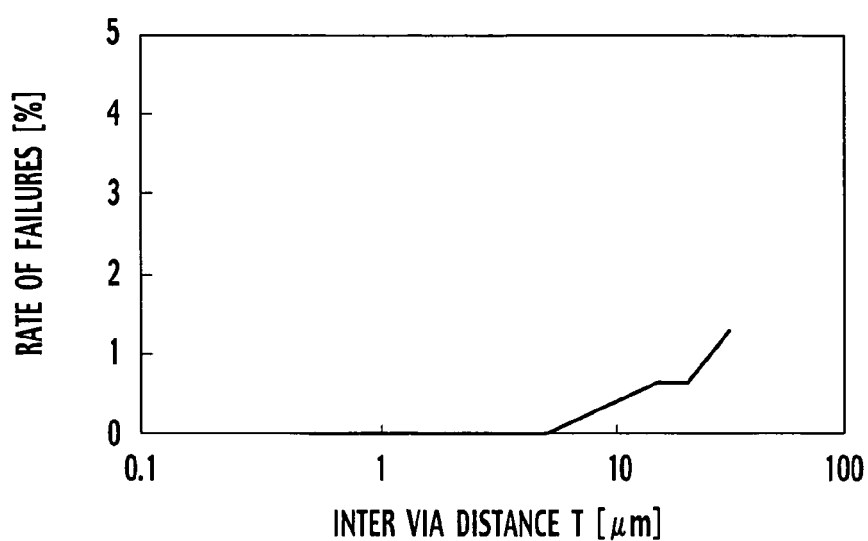
FIG. 10 is a graph showing a relationship between rate of failures due to stress migration and inter-via distance.

FIG. 10 shows the relationship between the failure rate and the inter-via distance T between the connecting via-plug 31 and the dummy via-plug 32 shown in FIG. 9. As shown in FIG. 10, since failures occur when the inter-via distance T exceeds 10 μm, it is preferable that the inter-via distance T between the connecting via-plug 31 and the dummy via-plug 32 be 10 μm or less. It is further preferable that the inter-via distance T be 5 μm or less. On the other hand, the minimum inter-via distance T between the connecting via-plug 31 and the dummy via-plug 32 is limited by performances of processing tools such as a photolithography tool or an etching tool; however, it is possible to be approximately 30 nm, for example. More specifically, grid intervals at the time of designing a mask pattern, namely, the inter-via distance T can be selected from triple, double, or single the minimum design rule F used for designing a mask pattern (T=3F, 2F, F). The design rule may be described using, for example, the minimum overlap length λ, which is the maximum misalignment of a feature. The maximum misalignment λ is a scalable and process dependent-parameter, and may be taken half the minimum design rule F according to Mead-Conway approach, for example. Under the definition (assumption) of the maximum misalignment λ, the minimum area of the via-hole can be taken as 2λ×2λ, and the minimum spacing between the via-holes can be taken as 2λ, for example. In addition, the minimum overlap length between the via-hole and the interconnect pattern can be taken as at least λ to ensure connection margin therebetween. On the other hand, the minimum width of the interconnect pattern can be taken as 2λ, for example. However, the minimum spacing of the interconnect pattern in the same wiring level can be taken as 3λ or 4λ, for example. This is because the interconnect pattern is formed at almost the final stage of a semiconductor device manufacturing process, and thus the underlying surface of the interconnect pattern is rough.

Figure 11:
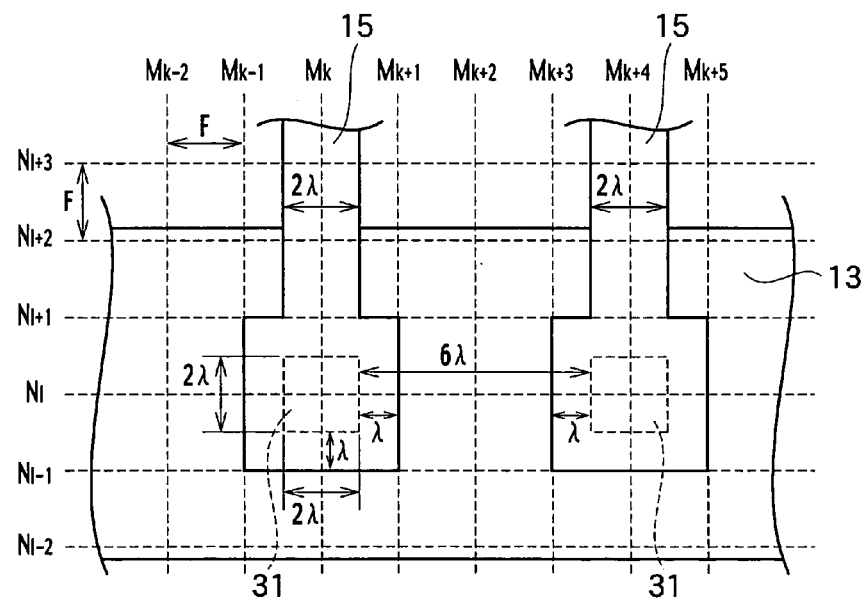
FIG. 11 is a schematic top view showing the minimum spacing between adjacent connecting via-plugs.
Figure 12:
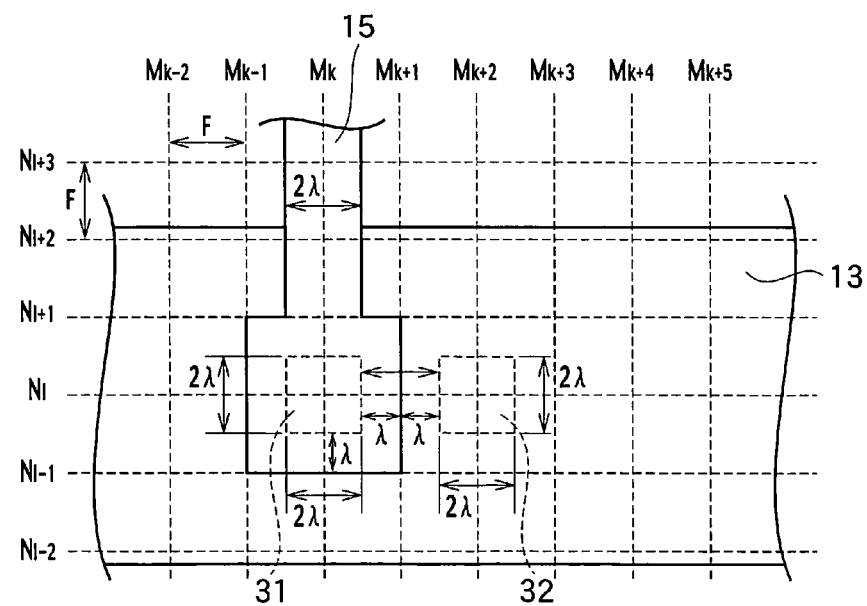
FIG. 12 is a schematic top view showing the minimum spacing between a conductive via and a dummy via-plug.

FIG. 11 is a top view of the adjacent connecting via-plugs 31 laid out at the minimum spacing in conformity with the above design rule. In FIG. 11, an imaginary wiring grid implemented by a plurality of regularly spaced first lines (vertical grid lines) $M_{k-1}$, $M_k$, $M_{k+1}$, $M_{k+2}$, and a plurality of regularly spaced second lines (horizontal grid lines) $N_{l-1}$, $N_l$, $N_{l+1}$, $N_{l+2}$, . . . intersecting with the first lines $M_{k-1}$, $M_k$, $M_{k+1}$, $M_{k+2}$, . . . are shown. The intervals between first lines (vertical grid lines) $M_{k-1}$, $M_k$, $M_{k+1}$, $M_{k+2}$, . . . and second lines (horizontal grid lines) $N_{l-1}$, $N_l$, $N_{l+1}$, $N_{l+2}$, . . . are the minimum design rule F. As shown in FIG. 11, the spacing between the adjacent connecting via-plugs 31 is at least approximately 6λ. FIG. 12 is a top view of the connecting via-plug 31 and the dummy via-plug 32 laid out at the minimum spacing. As with the case of FIG. 11, the intervals between the vertical grid lines $M_{k-1}$, $M_k$, $M_{k+1}$, $M_{k+2}$, . . . and the horizontal grid lines $N_{l-1}$, $N_l$, $N_{l+1}$, $N_{l+2}$, are the minimum design rule F. When laying out the dummy via-plug 32, it is unnecessary to consider a short-circuit failure between interconnect patterns in the same level. Therefore, as shown in FIG. 12, via-hole spacing may be set to the minimum of 2λ or the minimum design rule F.

According to the semiconductor device of the first embodiment of the present invention, by arranging the dummy via-plug 32, which does not affect semiconductor device operation, so as to be in contact with the subject level (first level) interconnect 13, the incidence rate of disconnection failures at the connecting via-plugs 31 due to stress migration can be reduced.

<First Manufacturing Method of the First Embodiment>

A first semiconductor device manufacturing method according to the first embodiment of the present invention is described while referencing FIGS. 13 through 19. Note that the first semiconductor device manufacturing method to be described below is merely an example, and naturally, various other manufacturing methods including modifications thereof are available.

(a) To begin with, a device isolation region, which are not shown in the drawing, is formed at the top surface of and in a semiconductor substrate 11 so as to define a plurality of active regions at the top surface of and in the semiconductor substrate 11 surrounded by the device isolation region. And diffused regions are formed in each of the active region so as to integrate active elements such as transistors at the top surface of and in the semiconductor substrate 11. Using chemical vapor deposition (CVD), the lower interlevel insulator (first interlevel insulator) 12 is formed on the entire surface of the semiconductor substrate 11 in which the active elements are merged, and the resulting surface of the lower interlevel insulator (first interlevel insulator) 12 is then planarized through chemical mechanical polishing (CMP). Not shown in the drawing, contact holes are then opened in the lower interlevel insulator (first interlevel insulator) 12 so as to bare selectively portions of predetermined electrodes of each of the active elements using photolithography and an etching technique. In addition, a damascene groove for the subject level (first level) interconnect 13 is formed at the top surface of and in the lower interlevel insulator (first interlevel insulator) 12 using photolithography and an etching technique. A metallic film such as copper is then deposited on the entire surface of the lower interlevel insulator (first interlevel insulator) 12 using vacuum evaporation or plating method or the like. Then, the resulting surface of the metallic film is then planarized using the CMP method until the top surface of the lower interlevel insulator (first interlevel insulator) 12 is bared so that the contact holes on the corresponding electrodes and the damascene groove can be filled with the metallic film. Afterwards, the subject interlevel insulator (second interlevel insulator) 14 is formed on the entire surface of the subject level (first level) interconnect 13, resulting in the cross-sectional structure shown in FIG. 13.

Figure 14:
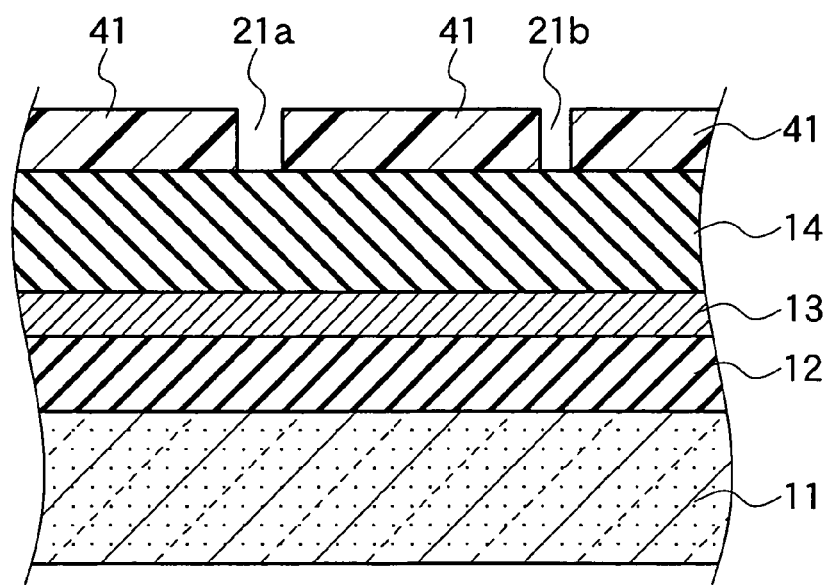
FIG. 14 is a second process flow cross-sectional view describing the semiconductor device manufacturing method according to the first embodiment of the present invention after the process stage shown in FIG. 13.
Figure 15:
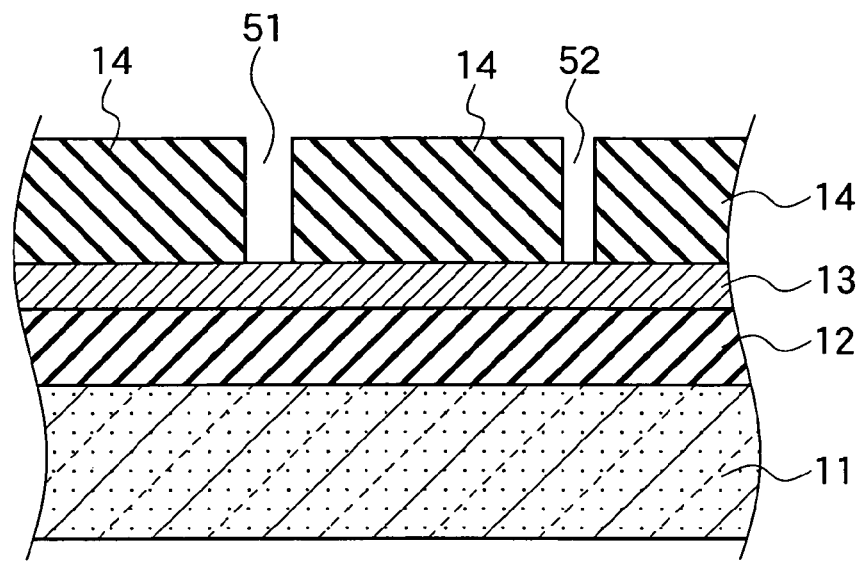
FIG. 15 is a third process flow cross-sectional view describing the semiconductor device manufacturing method according to the first embodiment of the present invention after the process stage shown in FIG. 14.

(b) Next, a photoresist film 41 is coated on the entire surface of the subject interlevel insulator (second interlevel insulator) 14. The photoresist film 41 is exposed to a light transmitted through a predetermined photomask and is undergone the develop process in the photoresist processing sequence of the photolithography, forming apertures 21a and 21b in photoresist film 41 so as to bare a part of the top surface of the subject interlevel insulator (second interlevel insulator) 14 as shown in FIG. 14.

(c) Next, the subject interlevel insulator (second interlevel insulator) 14 is selectively etched and removed using a reactive ion etching (RIE) method, using the photoresist film 41 as an etching mask, forming a conductive via-hole 51 and a dummy via-hole 52. Afterwards, the photoresist film 41 is removed, resulting in the cross-sectional structure shown in FIG. 15.

Figure 16:
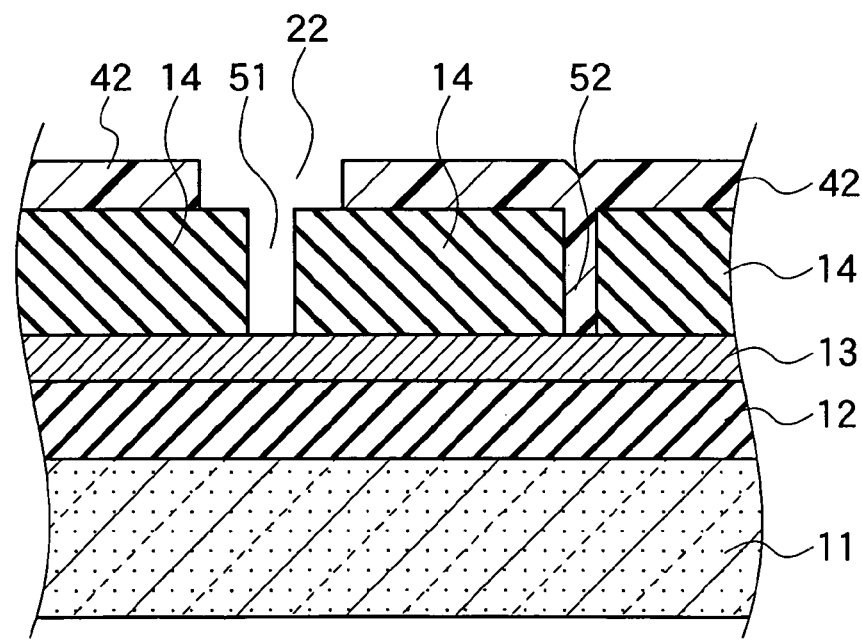
FIG. 16 is a fourth process flow cross-sectional view describing the semiconductor device manufacturing method according to the first embodiment of the present invention after the process stage shown in FIG. 15.
Figure 17:
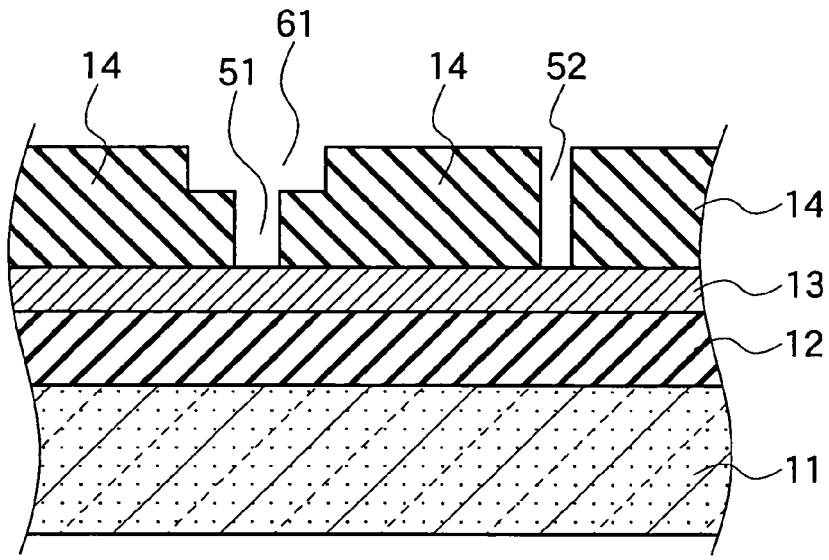
FIG. 17 is a fifth process flow cross-sectional view describing the semiconductor device manufacturing method according to the first embodiment of the present invention after the process stage shown in FIG. 16.

(d) Next, a new photoresist film 42 is coated upon the entire surface of the subject interlevel insulator (second interlevel insulator) 14, and the photoresist film 42 is then exposed to a light transmitted through a predetermined photomask and is undergone the develop process in the photoresist processing sequence of the photolithography, forming a slit 22 having a width larger than the diameter of the conductive via-hole 51 so as to uncovering the conductive via-hole 51 and a part of the top surface of the subject interlevel insulator (second interlevel insulator) 14 around the conductive via-hole 51 as shown in FIG. 16.

(e) Next, the subject interlevel insulator (second interlevel insulator) 14 is selectively etched using the RIE method, using the photoresist film 42 as an etching mask, so as to form a damascene groove 61 at the top surface of and in the subject interlevel insulator (second interlevel insulator) 14. Afterwards, the photoresist film 42 is removed, resulting in the cross-sectional structure shown in FIG. 17.

Figure 18:
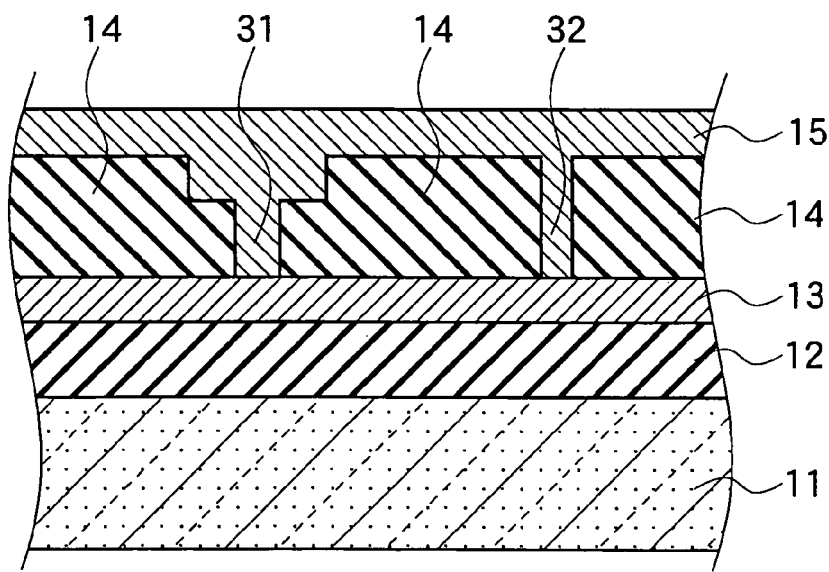
FIG. 18 is a sixth process flow cross-sectional view describing the semiconductor device manufacturing method according to the first embodiment of the present invention after the process stage shown in FIG. 17.

(f) As shown in FIG. 18, a metallic film 15 for the upper level (second level) interconnect is then deposited using the metal plating method so as to bury the conductive via-hole 51, the dummy via-hole 52, and the damascene groove 61, covering the entire surface of the subject interlevel insulator (second interlevel insulator) 14.

Figure 19:
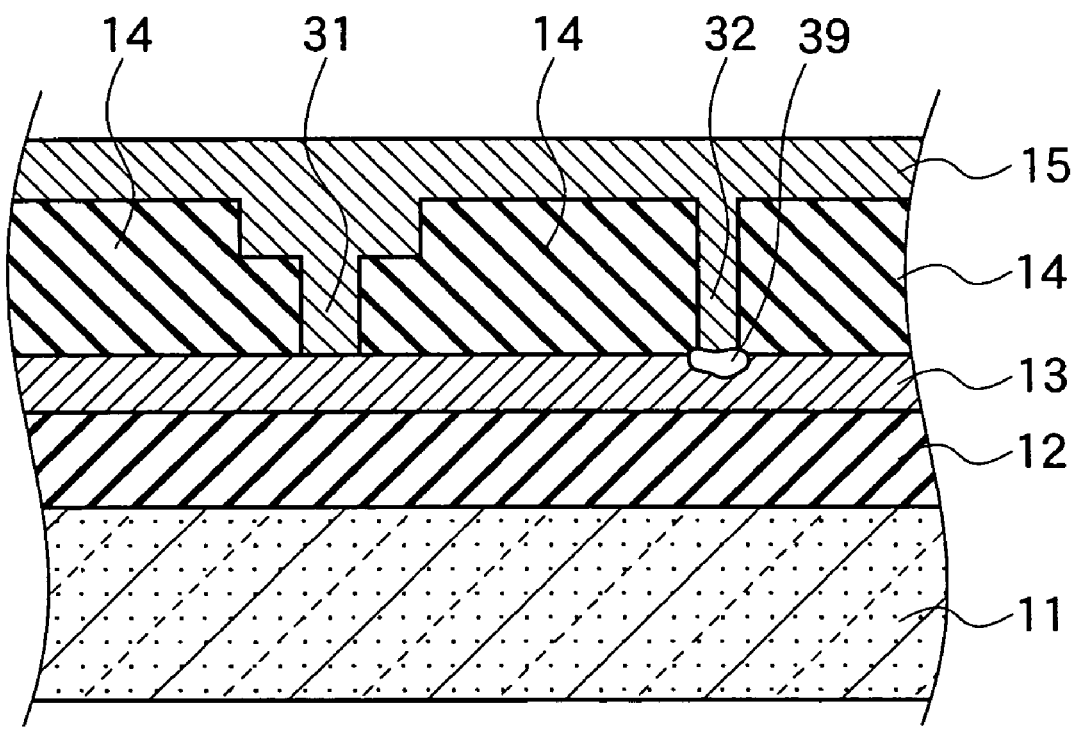
FIG. 19 is a cross-sectional view showing a void generated at the bottom of the dummy via-plug during a sequence of process stages shown in FIGS. 15 to 18.

(g) As shown in FIG. 19, a void 39 due to stress migration is generated at the bottom of the dummy via-plug 32. The void 39 is formed at a localized position on which a stress is applied during a via formation process and a copper interconnect formation process as shown in FIGS. 15 to 18. The bottom of the dummy via-plug 32 is disconnected from the subject level (first level) interconnect 13.

(h) In addition, a part of the metallic film 15 for the upper level (second level) interconnect is removed by the CMP method until the top surface of the subject interlevel insulator (second interlevel insulator) 14 is bared so as to bury the upper level (second level) interconnect in the damascene groove 61, the conductive via-plug 31 in the conductive via-hole 51, the dummy via-plug 32 in the dummy via-hole 52, thereby completing the configuration of the semiconductor device shown in FIGS. 3 and 4.

In the configuration of the semiconductor device shown in FIGS. 3 and 4, the void 39 generated at the bottom of the dummy via-plug 32 is not shown. However, as shown in FIG. 19, the first semiconductor device manufacturing method according to the first embodiment of the present invention can prevent voids from generating and concentrating at the connecting via-plug 31, and also prevents failures from occurring in the semiconductor device due to increase in the resistance of the connecting via-plug 31 or disconnection by quasi-intentionally generating the void 39 at the bottom of the dummy via-plug 32. Actually, by the distribution of voids, in some local potions of the semiconductor chip the void 39 may be generated at the bottom of the dummy via-plug 32, while at other local potions of the semiconductor chip, the void 39 may not be generated at the bottom of the dummy via-plug 32.

According to the first semiconductor device manufacturing method shown in FIGS. 13 through 19, burying the conductive via-plug 31 in the conductive via-hole 51, the dummy via-plug 32 in the dummy via-hole 52 and burying of the upper level (second level) interconnect 15 in the damascene groove 61, are carried out simultaneously, resulting in reduction of time and cost in the manufacturing process.

In addition, formation of a barrier metal layer prior to burying the upper level (second level) interconnect 15, and formation of the upper level (second level) interconnect 15 on the barrier metal layer are effective to reduce resistance. Titan (Ti), Tantalum (Ta), Tungsten (W) and a compound thereof such as TiN and TaN may be available for the barrier metal layer material.

<Second Manufacturing Method of the First Embodiment>

In FIGS. 13 through 19, the first semiconductor device manufacturing method of forming the conductive via-hole 51 and the dummy via-hole 52 prior to formation of the damascene groove 61 is described as one of the examples. Alternatively, the damascene groove 61 may be formed prior to formation of the conductive via-hole 51 and the dummy via-hole 52. Namely, another (second) semiconductor device manufacturing method according to the first embodiment of the present invention is described while referencing FIGS. 20 through 26.

Figure 13:
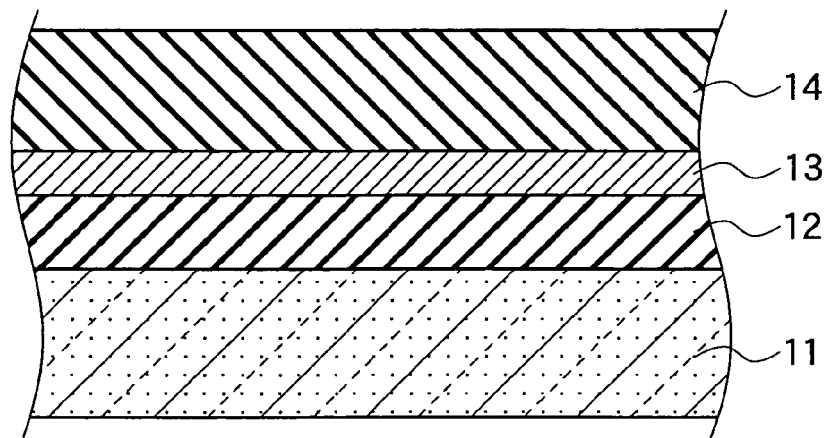
FIG. 13 is a first process flow cross-sectional view describing a semiconductor device manufacturing method according to the first embodiment of the present invention.
Figure 20:
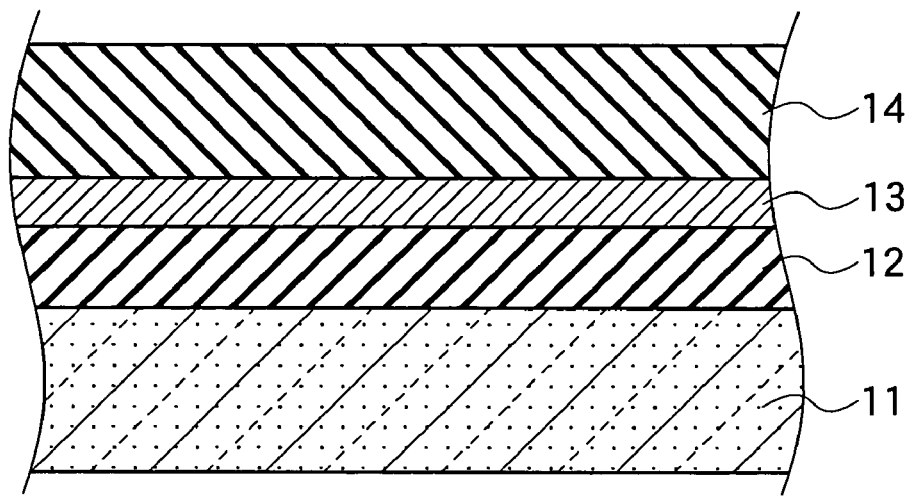
FIG. 20 is a first process flow cross-sectional view describing another (second) semiconductor device manufacturing method according to the first embodiment of the present invention.

(a) The cross-sectional structure shown in FIG. 20 is fabricated using the same method as that described referencing FIG. 13.

Figure 21:
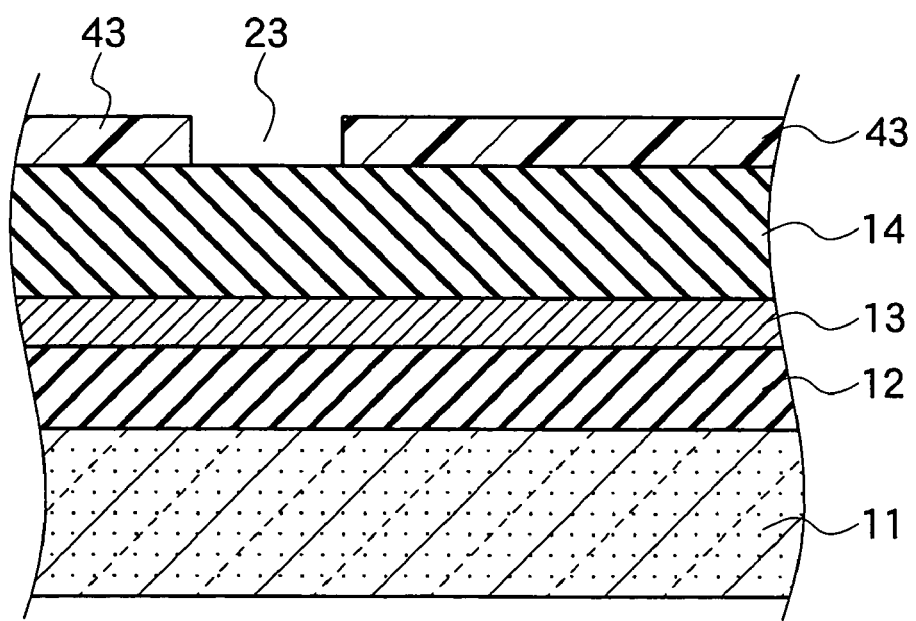
FIG. 21 is a second process flow cross-sectional view describing the second semiconductor device manufacturing method according to the first embodiment of the present invention after the process stage shown in FIG. 20.

(b) A photoresist film 43 is then coated on the entire surface of the subject interlevel insulator (second interlevel insulator) 14. The photoresist film 43 is exposed to a light transmitted through a predetermined photomask and is undergone the develop process in the photoresist processing sequence of the photolithography, forming a slit 23 in the photoresist film 43 so as to bare a part of the top surface of the subject interlevel insulator (second interlevel insulator) 14 as shown in FIG. 21.

Figure 22:
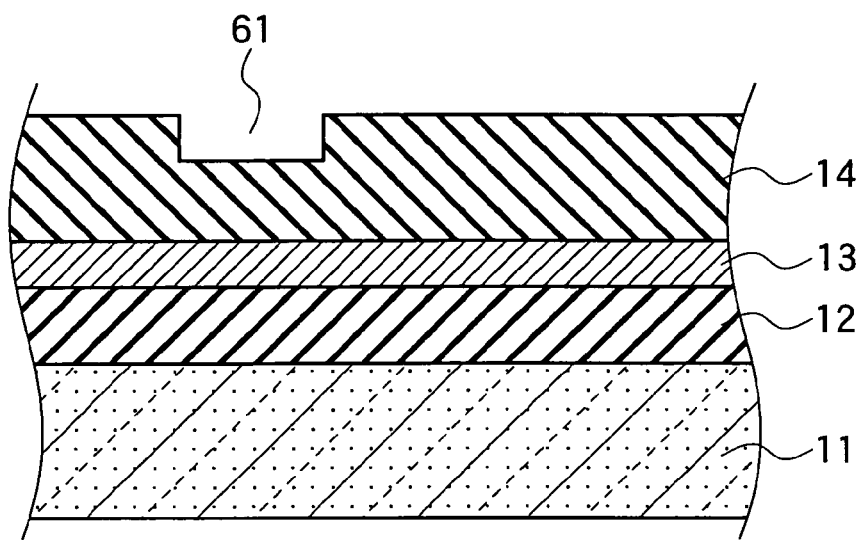
FIG. 22 is a third process flow cross-sectional view describing the second semiconductor device manufacturing method according to the first embodiment of the present invention after the process stage shown in FIG. 21.

(c) Next, the subject interlevel insulator (second interlevel insulator) 14 is selectively etched using the RIE method, using the photoresist film 43 as an etching mask, and the photoresist film 43 is then removed, forming a damascene groove 61 at the top surface of and in the subject interlevel insulator (second interlevel insulator) 14 as shown in FIG. 22.

Figure 23:
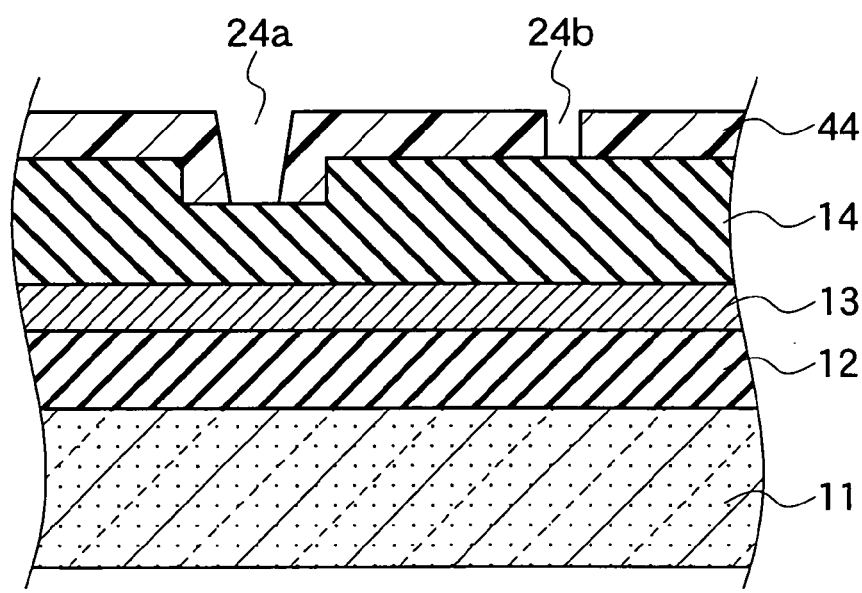
FIG. 23 is a fourth process flow cross-sectional view describing the second semiconductor device manufacturing method according to the first embodiment of the present invention after the process stage shown in FIG. 22.

(d) Next, a new photoresist film 44 is coated on the entire surface of the subject interlevel insulator (second interlevel insulator) 14, and the new photoresist film 44 is then exposed to a light transmitted through a predetermined photomask and is undergone the develop process in the photoresist processing sequence of the photolithography, forming apertures 24a and 24b in the photoresist film 44 so as to bare a part of the bottom of the damascene groove 61 and a part of the top surface of the subject interlevel insulator (second interlevel insulator) 14 as shown in FIG. 23.

Figure 24:
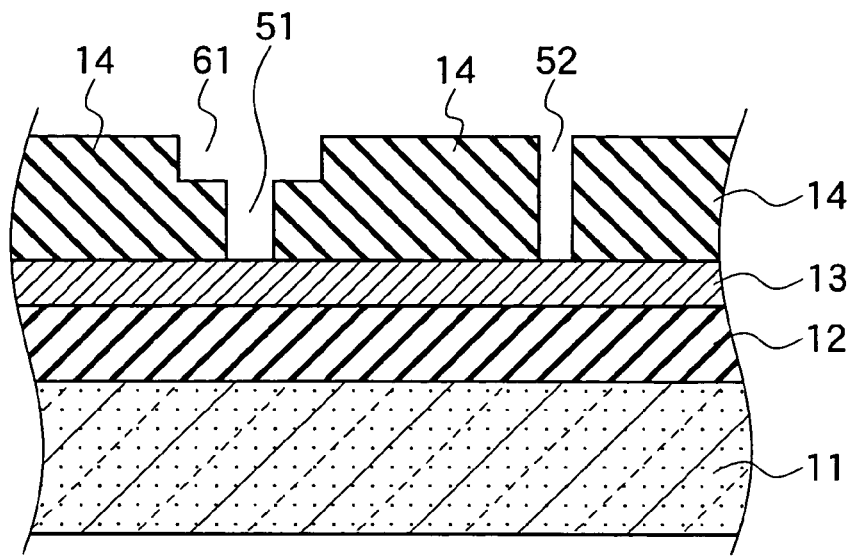
FIG. 24 is a fifth process flow cross-sectional view describing the second semiconductor device manufacturing method according to the first embodiment of the present invention after the process stage shown in FIG. 23.

(e) Next, a part of the subject interlevel insulator (second interlevel insulator) 14 is selectively etched and removed using the RIE method, using the photoresist film 44 as an etching mask, and the photoresist film 44 is then removed, forming the cross-sectional structure shown in FIG. 24 in which the conductive via-hole 51 and the dummy via-hole 52 are formed in the subject interlevel insulator (second interlevel insulator) 14.

Figure 25:
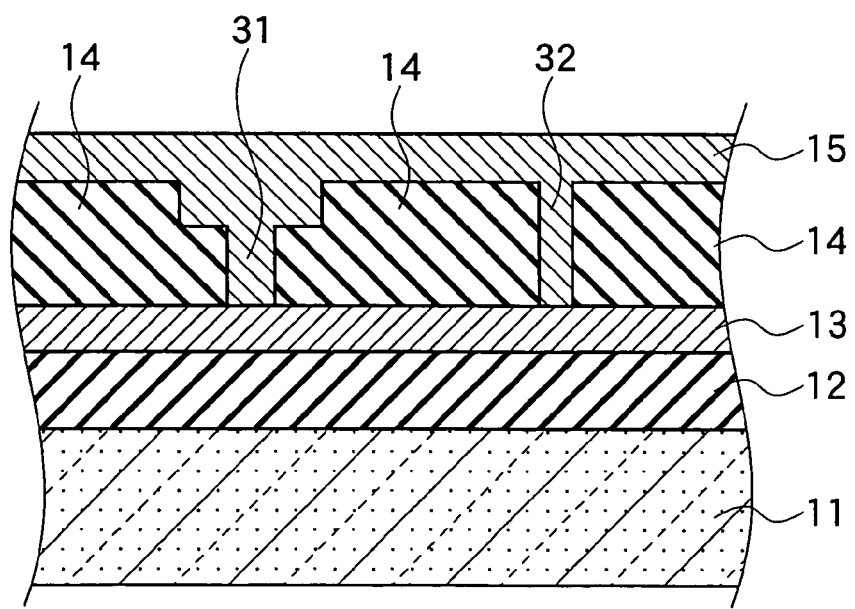
FIG. 25 is a sixth process flow cross-sectional view describing the second semiconductor device manufacturing method according to the first embodiment of the present invention after the process stage shown in FIG. 24.

(f) Next, as shown in FIG. 25, a metallic film for the upper level (second level) interconnect 15 is deposited using the metal plating method, so as to fill in the conductive via-hole 51, the dummy via-hole 52, and the damascene groove 61, and to cover the entire surface of the subject interlevel insulator (second interlevel insulator) 14.

Figure 26:
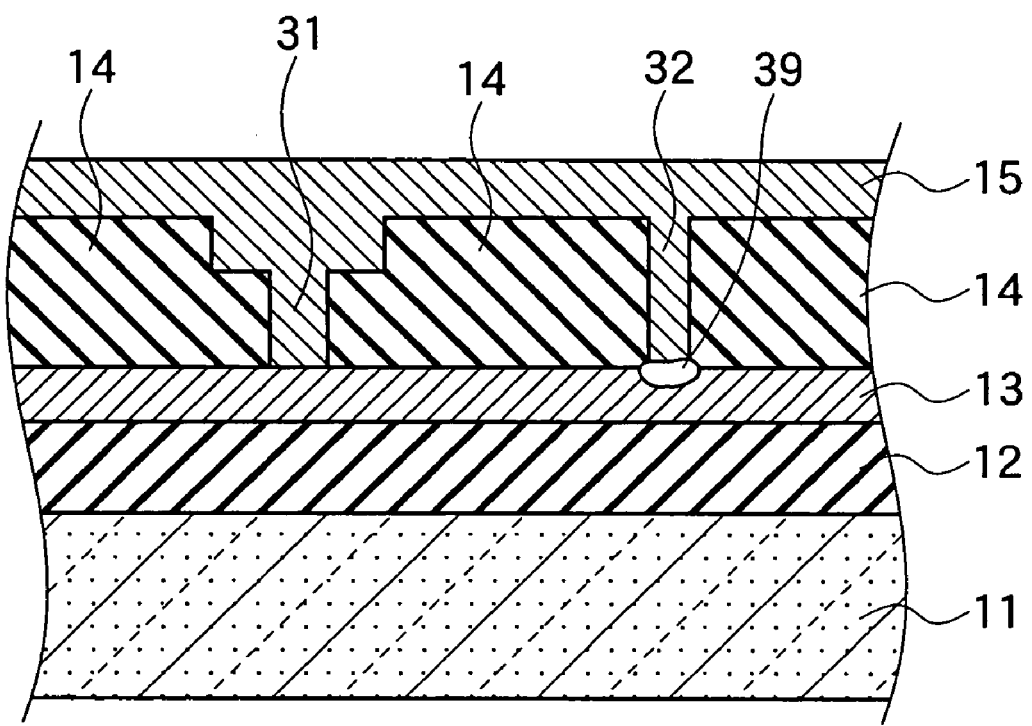
FIG. 26 is a cross-sectional view showing a void generated at the bottom of the dummy via-plug during a sequence of process stages shown in FIGS. 24 and 25.

(g) As shown in FIG. 26, a void 39 due to stress migration is generated at the bottom of the dummy via-plug 32, the void 39 is formed at a localized position on which a stress is applied during a via formation process and a copper interconnect formation process as shown in FIGS. 24 and 25. The bottom of the dummy via-plug 32 is disconnected from the subject level (first level) interconnect 13. However, as shown in FIG. 26, the second semiconductor device manufacturing method according to the first embodiment can prevent voids from generating and concentrating at the connecting via-plug 31, and also prevents failures from occurring in the semiconductor device due to increase in the resistance of the connecting via-plug 31 or disconnection.

(h) Then, a part of the metallic film for the upper level (second level) interconnect 15 is removed and planarized using the CMP method until the resulting surface becomes planarized with the top surface of the subject interlevel insulator (second interlevel insulator) 14, completing the semiconductor device shown in FIGS. 3 and 4.

According to the first and second semiconductor device manufacturing methods of the first embodiment of the present invention, incorporation of a process of forming the dummy via-hole 52 and the dummy via-plug 32 being in contact with the subject level (first level) interconnect 13 causes to establish a local portion susceptible to a strong stress, other than the portion at the interface between the subject level (first level) interconnect 13 and the connecting via-plug 31, during a fabrication process of the interconnect. This achieves a reduction in the incidence rate of disconnection failures at the interface between the subject level (first level) interconnect 13 and the connecting via-plug 31 due to stress migration.

<Modification of the First Embodiment>

To reduce the incidence rate of disconnection failures due to voids 39 generated at the interface between the connecting via-plug 31 and the subject level (first level) interconnect 13 by quasi-intentionally generating voids 39 due to stress migration at the interface between the dummy via-plug 32 and the subject level (first level) interconnect 13, the bottom surface of the dummy via-plug 32 should be in contact with the surface of the subject level (first level) interconnect 13 at earlier process stages of fabricating the dummy via-plug 32.

Figure 27:
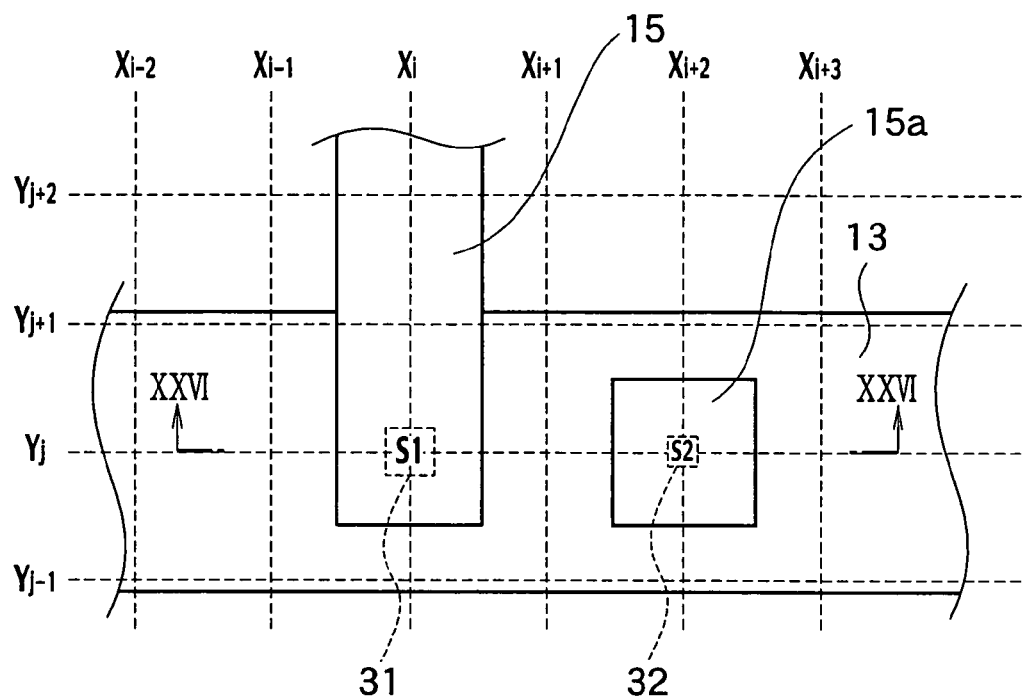
FIG. 27 is a schematic top view showing a configuration of a semiconductor device according to a modification of the first embodiment of the present invention.
Figure 28:
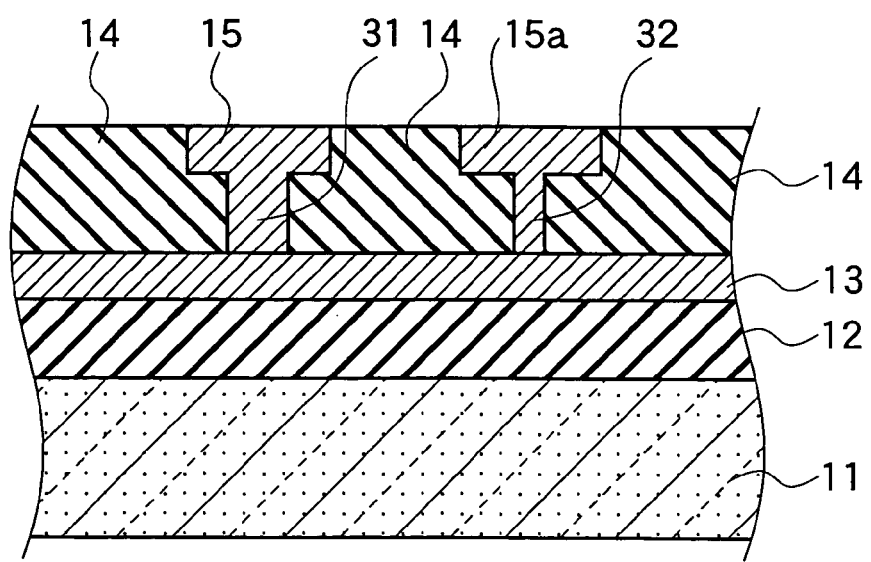
FIG. 28 is a cross-sectional view taken on line XXVI—XXVI in FIG. 27.
Figure 29:
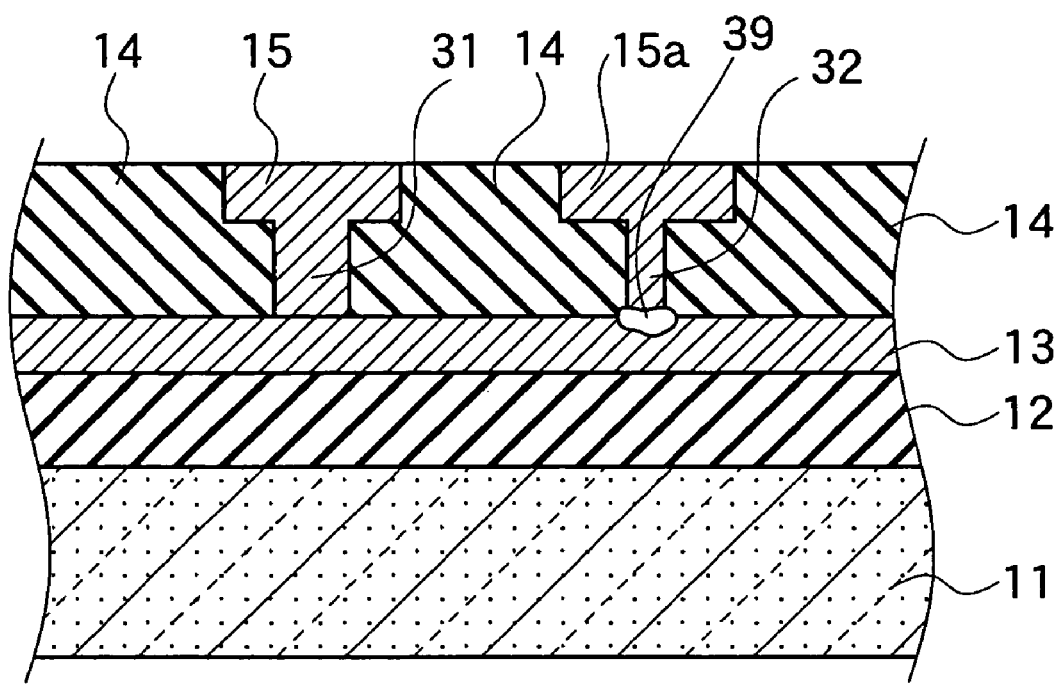
FIG. 29 is a cross-sectional view showing a void generated at the bottom of the dummy via-plug during a sequence of process stages in the semiconductor device manufacturing method according to a modification of the first embodiment of the present invention.

Namely, various topologies associated with the dummy via-plug 32 can be adopted, as long as the bottom surface of the dummy via-plug 32 is in contact with the surface of the subject level (first level) interconnect 13 at earlier process stages of manufacturing method for the semiconductor device. For example, a semiconductor device according to a modification of the first embodiment of the present invention shown in FIGS. 25 and 26 can achieve a reduction in the incidence rate of disconnection failures due to voids 39 at the connecting via-plug 31. The modification of the first embodiment is different from the semiconductor device shown in FIGS. 3 and 4 in that the modification of the first embodiment has an isolated depression (groove) formed at the top surface and in the subject interlevel insulator (second interlevel insulator) 14 in the upper portion of the dummy via-plug 32, and an isolated rectangular dummy pattern 15a is filled in the isolated depression as shown in FIGS. 27 and 28. The dummy pattern 15a is connected to the top surface of the dummy via-plug 32, and the subject interlevel insulator (second interlevel insulator) 14 surrounds four side surfaces defining the rectangular dummy pattern 15a. Formation of the isolated depression in which the dummy pattern 15a is to be filled can establish the same geometry associated with the dummy via-plug 32 as that of the connecting via-plug 31, which facilitates filling the conductive material for the dummy via-plug 32. It is unnecessary to add a fabrication process since the isolated depression in which the conductive material for the dummy pattern 15a is to be filled and the damascene groove 61 can be formed simultaneously.

Second Embodiment

Figure 30:
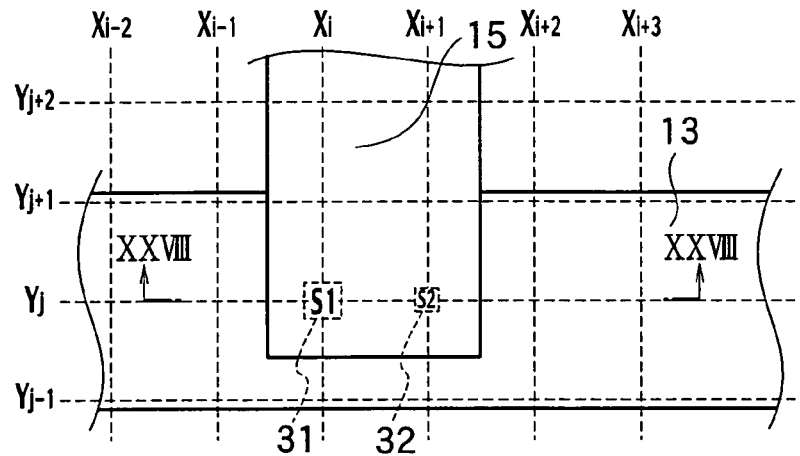
FIG. 30 is a schematic top view showing a configuration of a semiconductor device according to a second embodiment of the present invention.
Figure 31:
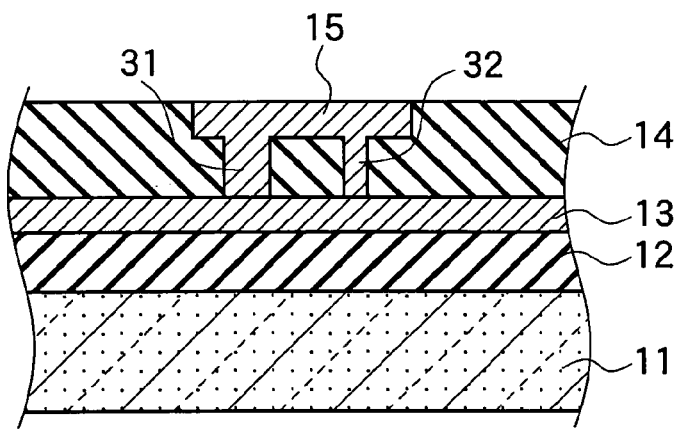
FIG. 31 is a cross-sectional view taken on line XXVIII—XXVIII in FIG. 30.

As shown in FIGS. 30 and 31, a semiconductor device according to a second embodiment has a multilevel interconnection including: a subject level (first level) interconnect 13, a subject interlevel insulator (second interlevel insulator) 14, which is disposed on the subject level (first level) interconnect 13, a connecting via-plug 31, which is formed by burying a conductive material in a first via-hole of the subject interlevel insulator (second interlevel insulator) 14 and which the bottom surface is in contact with the subject level (first level) interconnect 13, a dummy via-plug 32, which is made by burying a conductive material in a second via-hole in the subject interlevel insulator (second interlevel insulator) 14 and which the bottom surface is in contact with the subject level (first level) interconnect 13, and an upper level (second level) interconnect 15, which is disposed near the top surface of the subject interlevel insulator (second interlevel insulator) 14 and is in contact with the top surfaces of the connecting via-plug 31 and the dummy via-plug 32. In addition, the semiconductor device according to a second embodiment embraces a semiconductor substrate 11 and a lower interlevel insulator (first interlevel insulator) 12, which is disposed on the semiconductor substrate 11. Here, the subject level (first level) interconnect 13 is disposed on the lower interlevel insulator (first interlevel insulator) 12.

Furthermore, the interface area S1 between the bottom surface of the connecting via-plug 31 and the subject level (first level) interconnect 13 is larger than a cross-sectional area of the dummy via-plug 32 cut along a plane parallel to a plane on which the subject level (first level) interconnect 13 extending. Similar to the first embodiment, the area of the interface between the bottom surface of the dummy via-plug 32 and the top surface of the subject level (first level) interconnect 13 is defined to be "the interface area S2", if the bottom surface of the dummy via-plug 32 is contacted to the top surface of the subject level (first level) interconnect 13. The interface area S2 may be approximately same as the cross-sectional area of the dummy via-plug 32 cut along a plane parallel to a plane on which the subject level (first level) interconnect 13 extending, because the dummy via-plug 32 may have a geometry of a cylindrical pillar or a prism. Similarly, the interface area S1 may be approximately same as the area of the interface between the top of the connecting via-plug 31 and the bottom surface of the upper level (second level) interconnect 15, because the connecting via-plug 31 may have a geometry of a cylindrical pillar or a prism. Under these definitions and the condition that the bottom surface of the dummy via-plug 32 is contacted to the top surface of the subject level (first level) interconnect 13, the interface area S1 is larger than the interface area S2.

The topology of the semiconductor device according to the second embodiment is different from the topology of the semiconductor device according to the first embodiment shown in FIG. 4 in that the dummy via-plug 32 is electrically connected to the upper level (second level) interconnect 15. The dummy via-plug 32 can serve as an active via-plug, if the bottom surface of the dummy via-plug 32 is contacted to the top surface of the subject level (first level) interconnect 13 as represented by a configuration at a mask pattern level, or at earlier process stages of fabricating the dummy via-plug 32.

Figure 35:
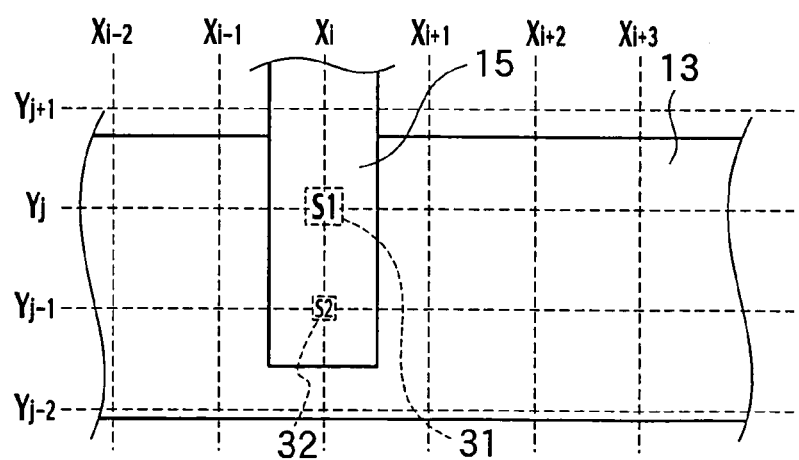
FIG. 35 is a schematic top view showing another configuration of a semiconductor device according to a modification of the second embodiment of the present invention.

As shown in FIG. 30, interconnect patterns of the semiconductor device according to the second embodiment of the present invention are provided based on an imaginary wiring grid implemented by a plurality of regularly spaced first lines (vertical grid lines) $X_{i-1}$, $X_i$, $X_{i+1}$, $X_{i+2}$, ... and a plurality of regularly spaced second lines (horizontal grid lines) $Y_{j-1}$, $Y_j$, $Y_{j+1}$, $Y_{j+2}$, ... intersecting with the first lines $X_{i-1}$, $X_i$, $X_{i+1}$, $X_{i+2}$, .... For example, as shown in FIG. 30, the connecting via-plug 31 is formed at the intersection of the first line (vertical grid line) $X_i$ and the second line (horizontal grid line) $Y_j$, and the dummy via-plug 32 is formed at the intersection of the first line (vertical grid line) $X_{i+1}$ and the second line (horizontal grid line) $Y_j$. The connecting via-plug 31 and the dummy via-plug 32 are arranged on mutually adjacent intersecting points of the imaginary wiring grid along the second line (horizontal grid line) $Y_j$. The topology is different from the semiconductor device according to the first embodiment shown in FIG. 3 in that the dummy via-plug 32 is formed in the damascene groove 61 in which the connecting via-plug 31 is formed and the upper level (second level) interconnect 15 is buried. The topology shown in FIGS. 30 and 31 achieves a reduction in the spacing between the connecting via-plug 31 and the dummy via-plug 32 to be narrower than ordinary spacing between the adjacent connecting via-plugs 31, irrelevant to the design rule. The topology of the second embodiment further achieves a reduction in the spacing between the connecting via-plug 31 and the dummy via-plug 32 to be narrower than, for example, the minimum design rule F, without forming the dummy via-plug 32 at the intersection of the first line (vertical grid line) $X_{i+1}$ and the second line (horizontal grid line) $Y_j$. In addition, there is no restriction on the relative positional relationship between the connecting via-plug 31 and the dummy via-plug 32. For example, as shown in FIG. 35, the connecting via-plug 31 may be arranged at the intersection of the first line (vertical grid line) $X_i$ and the second line (horizontal grid line) $Y_j$, and the dummy via-plug 32 may be arranged at the intersection of the first line (vertical grid line) $X_i$ and the second line (horizontal grid line) $Y_{j-1}$. The connecting via-plug 31 and the dummy via-plug 32 are arranged on mutually adjacent intersecting points of the imaginary wiring grid along the first line (vertical grid line) $X_i$. In other words, the connecting via-plug 31 and the dummy via-plug 32 may be arranged along the direction of current flowing through the upper level (second level) interconnect 15.

Figure 32:
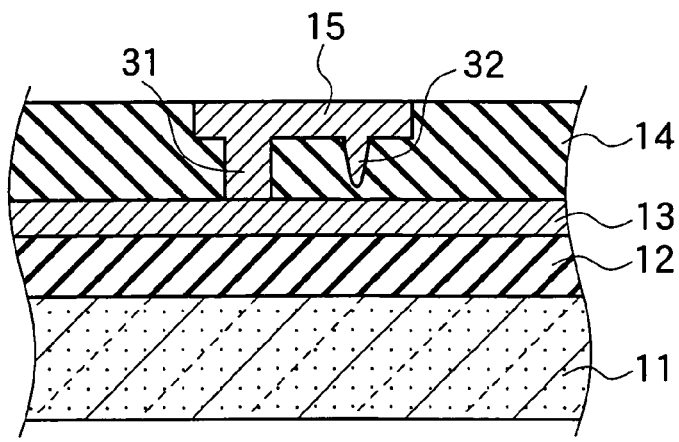
FIG. 32 is a cross-sectional view showing a dummy via-plug not reaching to the first level interconnects in the semiconductor device manufacturing method according to the second embodiment of the present invention.

In addition, since it is unnecessary for the dummy via-plug 32 to be connected with the subject level (first level) interconnect 13 as shown in FIG. 32, the opening size of the dummy via-plug 32 may be reduced to be smaller than the minimum design rule F. In order to reduce the opening size of the dummy via-plug 32 to be smaller than the minimum design rule F, the opening size of the dummy via-plug 32 on a mask (reticle) pattern for photolithography should be reduced to be smaller than the minimum design rule F.

If opening the dummy via-plug 32 with a smaller aperture than the minimum resolvable feature size of a stepper is needed as miniaturization of the semiconductor devices advances, the opening size of the dummy via-plug 32 should be reduced through the following sidewall formation process prior to filling the dummy via-hole 52 to form the dummy via-plug 32, for example.

(a) The cross-sectional structure of FIG. 22 where the damascene groove 61 is formed in the subject interlevel insulator (second interlevel insulator) 14 is obtained, using the same method as already explained in a process sequence described referencing FIGS. 20 through 26.

(b) Next, the conductive via-hole 51 and the dummy via-hole 52 are formed in the damascene groove 61 using photolithography and an etching technique.

(c) Next, a sidewall insulator film is deposited on the subject interlevel insulator (second interlevel insulator) 14 so as to bury the dummy via-hole 52. Afterwards, the sidewall insulator film on the top surface of the subject interlevel insulator (second interlevel insulator) 14 is removed using an anisotropic etching technique such as the RIE method so that the sidewall insulator film can be left on the sidewalls of the dummy via-hole 52. As a result, the aperture size of the dummy via-hole 52 is smaller than that of the conductive via-hole 51.

(d) Next, a metallic film 15 for the upper level (second level) interconnect is deposited on the entire surface of the subject interlevel insulator (second interlevel insulator) 14 using the metal plating method so as to bury the conductive via-hole 51, the dummy via-hole 52, and the damascene groove 61. In addition, the metallic film 15 for the upper level (second level) interconnect is removed and planarized using the CMP method until the resulting surface becomes planarized with the top surface of the subject interlevel insulator (second interlevel insulator) 14, forming the semiconductor device shown in FIGS. 30 and 31.

According to the above processes, the opening size of the dummy via-plug 32 can be reduced to be smaller than the minimum design rule F by reducing the aperture size of the dummy via-plug 32.

In addition, in the case of the semiconductor device according to the second embodiment, the current density and the like must be designed so that the semiconductor device can operate properly only through the connection of the connecting via-plugs 31 even if disconnection failures occur in the dummy via-plug 32. Naturally, there is no problem if disconnection does not occur in the dummy via-plug 32 and the conductive condition is kept.

Figure 33:
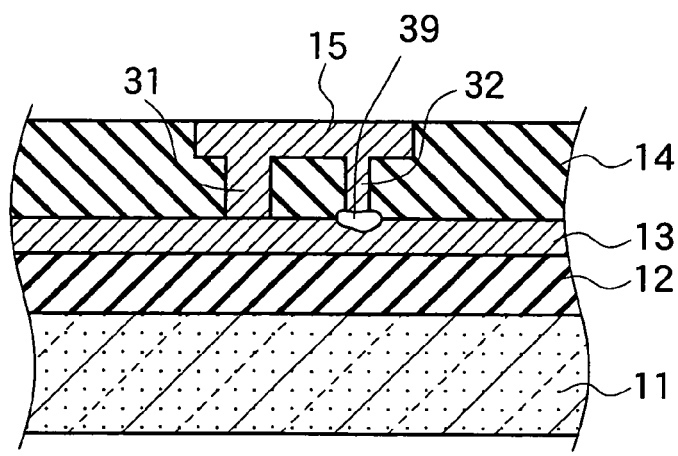
FIG. 33 is a cross-sectional view showing a void generated at the bottom of the dummy via-plug during a sequence of process stages in the semiconductor device manufacturing method according to the second embodiment of the present invention.

According to the second embodiment of the present invention, by quasi-intentionally generating voids 39 due to stress migration at the interface between the subject level (first level) interconnect 13 and the bottom of dummy via-plug 32 with a small interface area with the subject level (first level) interconnect 13 as shown in FIG. 33, the incidence rate of disconnection failures due to voids generated at the connecting via-plug 31 may decrease, although the bottom of the dummy via-plug 32 is disconnected from the subject level (first level) interconnect 13. Of cause, the dummy via-plug 32 can not serve as an active via-plug, if the bottom surface of the dummy via-plug 32 is disconnected to the top surface of the subject level (first level) interconnect 13 via presence of the void 39 generated at the bottom surface of the dummy via-plug 32. However, the dummy via-plug 32 can serve as the active via-plug, if the bottom surface of the dummy via-plug 32 is connected to the top surface of the subject level (first level) interconnect 13, if the void 39 is not generated at the bottom surface of the dummy via-plug 32.

Figure 34:
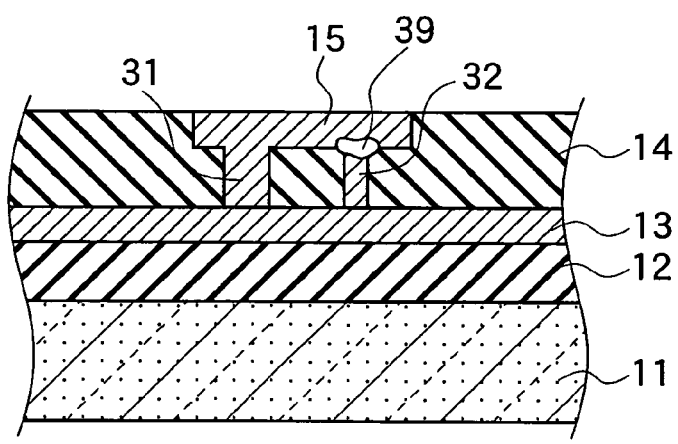
FIG. 34 is a cross-sectional view showing a void generated at the top of the dummy via-plug during a sequence of process stages in the semiconductor device manufacturing method according to the second embodiment of the present invention.

Or, the void 39 may be intentionally generated at the interface between the upper level (second level) interconnect 13 and the top of dummy via-plug 32 with a small interface area as shown in FIG. 34 so as to decrease the incidence rate of disconnection failures due to voids generated at the connecting via-plug 31, although the top of the dummy via-plug 32 is disconnected from the upper level (second level) interconnect 15. The dummy via-plug 32 can not serve as an active via-plug, if the top surface of the dummy via-plug 32 is disconnected to the bottom surface of the upper level (second level) interconnect 15 via presence of the void 39 generated at the top surface of the dummy via-plug 32. However, the dummy via-plug 32 can serve as the active via-plug, if the top surface of the dummy via-plug 32 is connected to the bottom surface of the upper level (second level) interconnect 15 and the bottom surface of the dummy via-plug 32 is connected to the top surface of the subject level (first level) interconnect 13, if the void 39 is not generated at the top surface or at the bottom surface of the dummy via-plug 32.

The other features are basically the same as the semiconductor device according to the first embodiment, and repetitive descriptions thereof are thus omitted.

OTHER EMBODIMENTS

Various modifications will become possible for those skilled in the art after receiving the teaching of the present disclosure without departing from the scope thereof.

In the above-described first and second embodiments, there is one dummy via-plug 32; alternatively, multiple dummy via-plugs may be provided. In addition, the shape of the dummy via-plug 32 may be a square, a rectangle, a circle, or a triangle.

Furthermore, the dummy via-plug may be provided between the arbitrary interconnect layers in a semiconductor device with a multilevel interconnection having three or more interconnect levels. That is, although the configuration in which the subject level interconnect is assumed to be the first level interconnect 13, the upper level interconnect is assumed to be second level interconnect 15 so as to sandwich the subject interlevel insulator, which is taken as the second interlevel insulator 14 is described, the subject level interconnect can be the second level interconnect 14, and in this case, the upper level interconnect is taken as third level interconnect, sandwiching the subject interlevel insulator, which may be taken as the third interlevel insulator. Or, the subject level interconnect can be a third level interconnect 13, the upper level interconnect is a fourth level interconnect 15, sandwiching as the subject interlevel insulator, a fourth interlevel insulator.

In FIGS. 13 through 19, or FIGS. 20 through 26, the semiconductor device manufacturing method of burying the upper level interconnect 15 in the damascene groove formed in the subject interlevel insulator 14 is described. Alternatively, after deposition of the upper level interconnect 15 on the subject interlevel insulator 14, the upper level interconnect 15 may be formed using photolithography, etching, and liftoff technology, without using the damascene process.

Thus, the present invention of course includes various embodiments and modifications and the like which are not detailed above. Therefore, the scope of the present invention will be defined in the following claims.

What is claimed is:

1. A semiconductor device, having multilevel interconnection comprising:
   a subject level interconnect;
   a subject interlevel insulator disposed on the subject level interconnect;
   a connecting via-plug buried in the subject interlevel insulator, the bottom surface of the connecting via-plug is in contact with the subject level interconnect;
   a dummy via-plug buried in the subject interlevel insulator, the top surface of the dummy via-plug is electrically open; and
   an upper level interconnect of the subject level interconnect, disposed at the top surface of the subject interlevel insulator, being in contact with the top surface of the connecting via-plug,
   wherein, when viewed on an imaginary wiring grid implemented by a plurality of first lines and a plurality of second lines intersecting with the first lines:
   the subject level interconnect extends along one of the first lines;
   the upper level interconnect extends along one of the second lines; and
   the connecting and dummy via-plugs are arranged on intersecting points between the first lines and the second lines.

2. The semiconductor device of claim 1, wherein the imaginary wiring grid is implemented by regularly spaced first lines having a pitch of the minimum design rule and regularly spaced second lines having the pitch, and the distance between the connecting via-plug and the dummy via-plug is double the minimum design rule.

3. The semiconductor device of claim 1, wherein the imaginary wiring grid is implemented by regularly spaced first lines having a pitch of the minimum design rule and regularly spaced second lines having the pitch, and the distance between the center of the connecting via-plug and the center of the dummy via-plug is double the minimum design rule.

4. The semiconductor device of claim 1, wherein the upper level interconnect is formed of a metallic wiring buried in a damascene groove dug at the top surface of and in the subject interlevel insulator.

5. The semiconductor device of claim 1, wherein the subject level interconnect, the upper level interconnect, the connecting via-plug and the dummy via-plug are formed of a metallic film including copper as a main component.

6. The semiconductor device of claim 1, wherein the bottom surface of the dummy via-plug is in contact with the subject level interconnect.

7. The semiconductor device of claim 6, wherein the area of the interface between the bottom surface of the connecting via-plug and the top surface of the subject level interconnect is larger than the area of the interface between the bottom surface of the dummy via-plug and the top surface of the subject level interconnect.

8. The semiconductor device of claim 1, wherein the top surface of the dummy via-plug is in contact with an isolated pattern having a same thickness as the upper level interconnect.

9. The semiconductor device of claim 1, wherein a distance between the connecting via-plug and the dummy via-plug is equal to or less than 10 μm.

10. A semiconductor device having a multilevel interconnection comprising:
a subject level interconnect;
a subject interlevel insulator disposed on the subject level interconnect;
a connecting via-plug buried in the subject interlevel insulator, the bottom surface of the connecting via-plug is in contact with the subject level interconnect;
a dummy via-plug buried in the subject interlevel insulator; and
an upper level interconnect of the subject level interconnect, disposed at the top surface of the subject interlevel insulator, being in contact with the top surfaces of the connecting and dummy via-plugs,
wherein the area of the interface between the bottom surface of the connecting via-plug and the top surface of the subject level interconnect is larger than the cross-sectional area of the dummy via-plug cut along a plane parallel to a plane on which the subject level interconnect extends.

11. The semiconductor device of claim 10, wherein the bottom surface of the dummy via-plug is in contact with the subject level interconnect.

12. The semiconductor device of claim 10, wherein the maximum diameter of the dummy via-plug is smaller than the minimum design rule, the maximum diameter is measured on the cross-sectional area of the dummy via-plug cut along the plane parallel to the plane on which the subject level interconnect extends.

13. The semiconductor device of claim 10, wherein a distance between the center of the connecting via-plug and the center of the dummy via-plug is equal to or less than double the minimum design rule.

14. The semiconductor device of claim 10, wherein, when viewed on an imaginary wiring grid implemented by a plurality of first lines and a plurality of second lines intersecting with the first lines:
the subject level interconnect extends along one of the first lines;
the upper level interconnect extends along one of the second lines; and
the connecting and dummy via-plugs are arranged on intersecting points of the imaginary wiring grid along one of the first lines.

15. The semiconductor device of claim 10, wherein, when viewed on an imaginary wiring grid implemented by a plurality of first lines and a plurality of second lines intersecting with the first lines:
the subject level interconnect extends along one of the first lines;
the upper level interconnect extends along one of the second lines; and
the connecting and dummy via-plugs are arranged on intersecting points of the imaginary wiring grid along one of the second lines.

16. The semiconductor device of claim 15, wherein the connecting and dummy via-plugs are arranged on mutually adjacent intersecting points of the imaginary wiring grid.

17. The semiconductor device of claim 10, wherein the upper level interconnect is formed of a metallic wiring buried in a damascene groove dug at the top surface of and in the subject interlevel insulator.

18. A method for manufacturing a semiconductor device having a multilevel interconnection comprising:
forming a subject level interconnect;
laminating a subject interlevel insulator on the subject level interconnect;
digging a connecting via-hole and a dummy via-hole in the subject interlevel insulator so as to bare a part of the subject level interconnect;
digging a damascene groove at the top surface of and in the subject interlevel insulator so as to pass over the connecting via-hole; and
forming a metallic film in the connecting via-hole, the dummy via-hole and the damascene groove so as to form a dummy via-plug buried in the dummy via-hole, the top surface of the dummy via-plug is electrically open, an upper level interconnect of the subject level interconnect buried in the damascene groove and a connecting via-plug buried in the connecting via-hole, the top surface of the connecting via-plug is connected to the bottom surface of the upper level interconnect.
wherein, when viewed on an imaginary wiring grid implemented by a plurality of first lines and a plurality of second lines intersecting with the first lines: the subject level interconnect extends along one of the first lines; the upper level interconnect extends along one of the second lines; and the connecting and dummy via-plugs are arranged on intersecting points of the imaginary wiring grid along one of the second lines.

19. The method of claim 18, wherein the area of the interface between the bottom surface of the connecting via-plug and the top surface of the subject level interconnect is larger than the area of the interface between the bottom surface of the dummy via-plug and the top surface of the subject level interconnect.

* * * * *